(12) United States Patent
Price et al.

(10) Patent No.: US 10,831,032 B2
(45) Date of Patent: Nov. 10, 2020

(54) PHOTO-SENSING REFLECTORS FOR COMPACT DISPLAY MODULE ASSEMBLY

(71) Applicant: MICROSOFT TECHNOLOGY LICENSING, LLC, Redmond, WA (US)

(72) Inventors: Raymond Kirk Price, Redmond, WA (US); Rachel N. Ulanch, Seattle, WA (US); Joshua Owen Miller, Woodinville, WA (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 0 days.

(21) Appl. No.: 16/289,392

(22) Filed: Feb. 28, 2019

(65) Prior Publication Data

US 2020/0278545 A1  Sep. 3, 2020

(51) Int. Cl.
| | |
|---|---|
| *G02B 27/01* | (2006.01) |
| *G02B 26/08* | (2006.01) |
| *G02B 27/30* | (2006.01) |
| *G02B 27/09* | (2006.01) |
| *G02B 26/10* | (2006.01) |

(Continued)

(52) U.S. Cl.
CPC ....... *G02B 27/0172* (2013.01); *G02B 26/101* (2013.01); *G02B 27/0977* (2013.01); *G02B 27/1006* (2013.01); *G02B 27/30* (2013.01); *G06T 19/006* (2013.01)

(58) Field of Classification Search
None
See application file for complete search history.

(56) References Cited

U.S. PATENT DOCUMENTS

| | | |
|---|---|---|
| 5,018,156 A | 5/1991 | Hashimoto et al. |
| 6,741,351 B2 | 5/2004 | Marshall et al. |
| 6,763,046 B2 | 7/2004 | Baillargeon et al. |

(Continued)

FOREIGN PATENT DOCUMENTS

| | | |
|---|---|---|
| EP | 1489607 A2 | 12/2004 |
| GB | 2553348 B | 10/2018 |
| WO | 2010079072 A1 | 7/2010 |

OTHER PUBLICATIONS

"International Search Report and Written Opinion Issued in PCT Application No. PCT/US2020/017572", dated May 8, 2020, 12 Pages.

(Continued)

*Primary Examiner* — Benjamin C Lee
*Assistant Examiner* — Krishna P Neupane
(74) *Attorney, Agent, or Firm* — Workman Nydegger

(57) ABSTRACT

Techniques are provided to re-arrange the placement of a photodiode within an illumination system to achieve improved characteristics and reduced form factor. An illumination system includes a laser assembly, a MEMS mirror system, a beam combiner, and a photodiode. The laser assembly includes RGB lasers, and the MEMS mirror system redirects laser light produced by the RGB lasers to illuminate pixels in an image frame. The beam combiner combines the laser light. The photodiode is provided to determine a power output of the laser assembly by receiving and measuring some of the laser light. The photodiode may be beneficially positioned before or after collimating optics and/or the beam combiner.

21 Claims, 17 Drawing Sheets

(51) Int. Cl.
  *G02B 27/10* (2006.01)
  *G06T 19/00* (2011.01)

(56) References Cited

U.S. PATENT DOCUMENTS

| | | |
|---|---|---|
| 6,970,491 B2 | 11/2005 | Bhandarkar |
| 7,053,415 B2 | 5/2006 | Swirhun et al. |
| 7,709,358 B2 | 5/2010 | Guenter et al. |
| 8,727,567 B1 | 5/2014 | Tien et al. |
| 9,008,139 B2 | 4/2015 | Monadgemi et al. |
| 9,053,717 B1 | 6/2015 | Matsumoto et al. |
| 9,927,611 B2 | 3/2018 | Rudy et al. |
| 2004/0105377 A1 | 6/2004 | Taniguchi et al. |
| 2007/0152129 A1* | 7/2007 | Li .................. G02B 27/102 250/201.3 |
| 2008/0037090 A1 | 2/2008 | Miller et al. |
| 2015/0161926 A1* | 6/2015 | Ogi ................ H04N 9/3129 345/207 |
| 2017/0141531 A1 | 5/2017 | Kyono et al. |
| 2017/0227839 A1 | 8/2017 | Maaskant et al. |
| 2017/0285936 A1* | 10/2017 | Hirshberg ............ G09G 3/003 |
| 2018/0120150 A1 | 5/2018 | Cahill |
| 2018/0131911 A1* | 5/2018 | Mizuno ............... G02B 27/01 |
| 2018/0149874 A1* | 5/2018 | Aleem ................ G02B 27/01 |
| 2018/0180885 A1 | 6/2018 | Holland et al. |
| 2018/0180886 A1* | 6/2018 | Holland ........... G02B 26/0816 |
| 2020/0280162 A1 | 9/2020 | Price et al. |

OTHER PUBLICATIONS

"International Search Report and Written Opinion Issued in PCT Application No. PCT/US2020/017810", dated Jun. 8, 2020, 13 Pages.

* cited by examiner

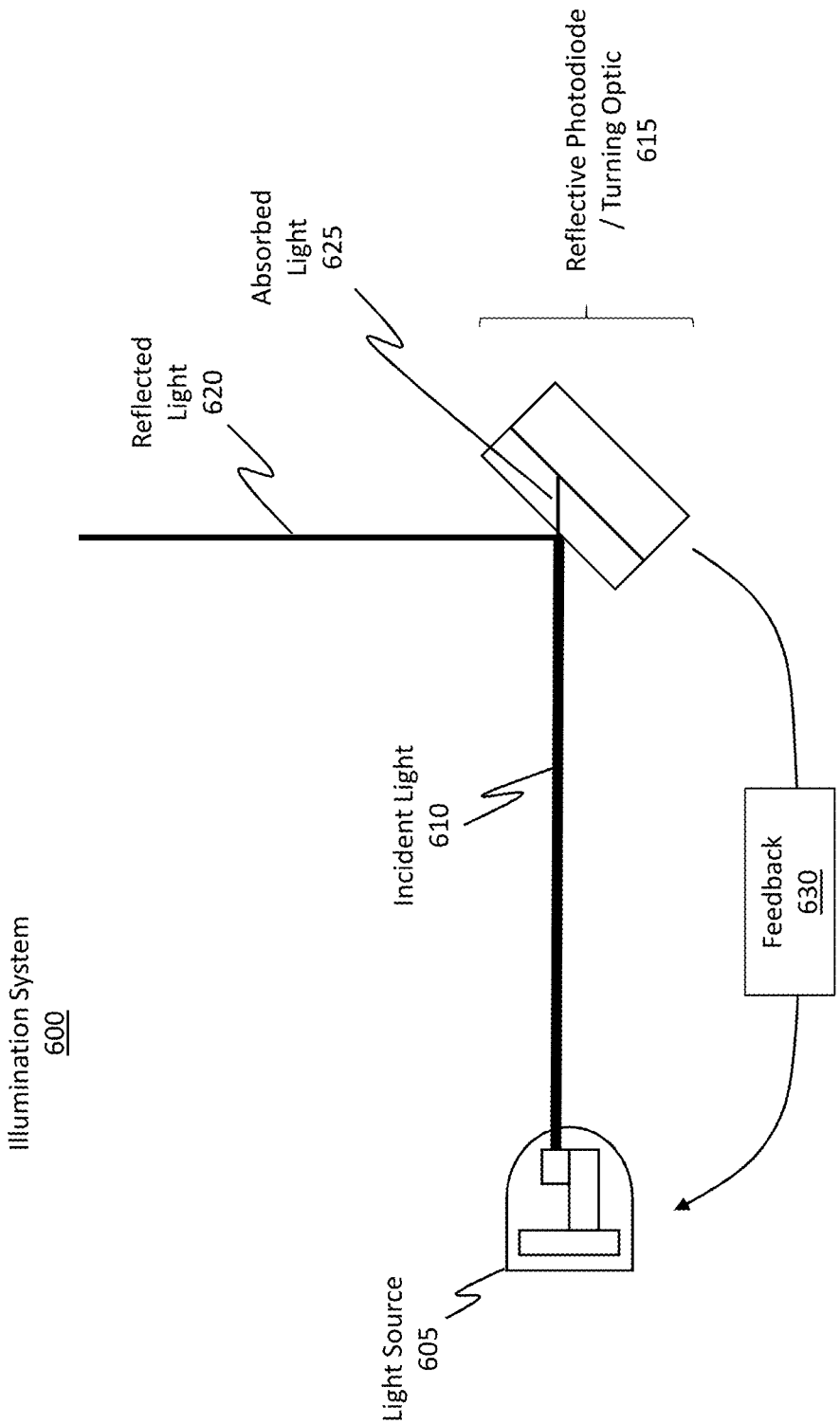

PHOTO-SENSING REFLECTORS FOR COMPACT DISPLAY MODULE ASSEMBLY

BACKGROUND

A laser is a type of device that generates a beam of coherent light. Most lasers include a resonant cavity that is defined by the structure of the laser and that spans the length of the laser. When current is injected into the laser, spontaneously emitted photons are generated. Some of these spontaneously emitted photons will successfully couple to the laser's resonant cavity. Provided that the laser is biased above its lasing current threshold, the photon density will increase inside of the resonant cavity and eventually a pulse of laser light will be generated and emitted from the laser.

Lasers can be used in many different applications. For instance, lasers can be used for communication, biomedical imaging, precision metrology, and even for generating images, such as for virtual-reality or augmented-reality (collectively "mixed-reality") systems.

In many scenarios/applications, especially in mixed-reality systems, a laser operates in conjunction with one or more collimating optic(s), beam combiner(s) (e.g., a dichroic prism), and photodiodes. For instance, many mixed-reality systems use a red, green, blue (RGB) laser to generate virtual image content for the mixed-reality scene. The laser light generated by the RGB (and/or IR) lasers is often collimated through a collimating optic and then spectrally/optically combined via a beam combiner. To finely control the output of the laser (especially due to changing operational conditions such as changes to the laser's lasing current threshold or its slope efficiency), a portion of the laser's laser light is also often measured by a photodiode.

As laser-based systems become more advanced, it is becoming more and more desirable to employ lasers and associated components (e.g., collimating optics, beam combiners, and photodiodes) that have small/smaller form factors. Use of smaller units means that more hardware can be packaged together at reduced costs. Accordingly, there is a substantial need in the field to reduce the size of laser-based systems and/or to improve the arrangement/positioning of the components relative to one another.

The subject matter claimed herein is not limited to embodiments that solve any disadvantages or that operate only in environments such as those described above. Rather, this background is only provided to illustrate one exemplary technology area where some embodiments described herein may be practiced.

BRIEF SUMMARY

Embodiments disclosed herein relate to systems, methods, and devices that re-position, or rather re-arrange, the placement of a photodiode within an illumination system to achieve improved design characteristics/flexibility and a smaller packaging size.

In some embodiments, an illumination system is provided to render images for a mixed-reality system. The illumination system includes a laser assembly, a microelectromechanical scanning (MEMS) mirror system, a beam combiner, and a photodiode. The laser assembly includes RGB lasers. The MEMS mirror system is configured to redirect the laser light produced by the RGB lasers to illuminate pixels in an image frame for the mixed-reality system. Additionally, the beam combiner is configured to combine the laser light produced by the RGB lasers. The photodiode is provided to determine a power output of the laser assembly by receiving and measuring a first portion of the laser light. Furthermore, the photodiode is positioned upstream of the beam combiner. Consequently, the photodiode is positioned between the laser assembly and the beam combiner relative to a path traveled by the laser light from the laser assembly to the beam combiner.

In some embodiments, an illumination system includes a laser assembly that itself includes a red, green, and blue laser. The lasers are associated with at least one collimating optic, and each laser emits corresponding laser light (e.g., red laser light, green laser light, and blue laser light). The illumination system also includes a multi-section photodiode that includes a red section photodiode for absorbing and measuring a first portion of the red laser light, a green section photodiode for absorbing and measuring a first portion of the green laser light, and a blue section photodiode for absorbing and measuring a first portion of the blue laser light. These first portions of light are used to determine a power output of the laser assembly. The illumination system further includes a beam combiner, which combines second portions of the red, green, and blue laser light to form combined laser light, and a MEMS mirror system that redirects the combined laser light to illuminate pixels in an image frame. In accordance with some embodiments, the multi-section photodiode is positioned upstream of the beam combiner. As a result, the multi-section photodiode is positioned between the laser assembly and the beam combiner relative to a path traveled by the red, green, and blue laser light.

In some embodiments, an illumination system includes a laser assembly comprising RGB lasers that emit red, green, and blue laser light. The illumination system also includes a first collimating optic that collimates the red laser light, a second collimating optic that collimates the green laser light, and a third collimating optic that collimates the blue laser light. A photodiode is provided to absorb and measure first portions of the collimated red, green, and blue laser light. These first portions are used to determine a power output of the laser assembly. The illumination system further includes a beam combiner that combines second portions of the collimated red, green, and blue laser light to form combined laser light. A MEMS mirror system then redirects the combined laser light to illuminate pixels in an image frame for a mixed-reality system. The photodiode is positioned downstream relative to the first, second, and third collimating optics and is positioned upstream relative to the beam combiner.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description which follows, and in part will be obvious from the description, or may be learned by the practice of the teachings herein. Features and advantages of the invention may be realized and obtained by means of the instruments and combinations particularly pointed out in the appended claims. Features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features can be obtained, a more particular description of the subject matter briefly described above will be rendered by reference to specific embodiments which are illustrated in the appended drawings. Understanding that these drawings depict only typical embodiments and are not therefore to be considered to be limiting in scope, embodiments will be described and explained with additional specificity and detail through the use of the accompanying drawings in which:

FIG. 2A also shows how the reflective photodiode may be positioned within the illumination system between a light source and a beam combiner and between the light source and a collimating optic.

FIG. 6 illustrates an example technique in which the reflective photodiode is providing feedback to the light source, where the feedback includes information detailing or describing the operational characteristics (e.g., power output, lasing current threshold, slope efficiency, etc.) of the light source, as measured by the reflective photodiode.

DETAILED DESCRIPTION

Figure 1A:
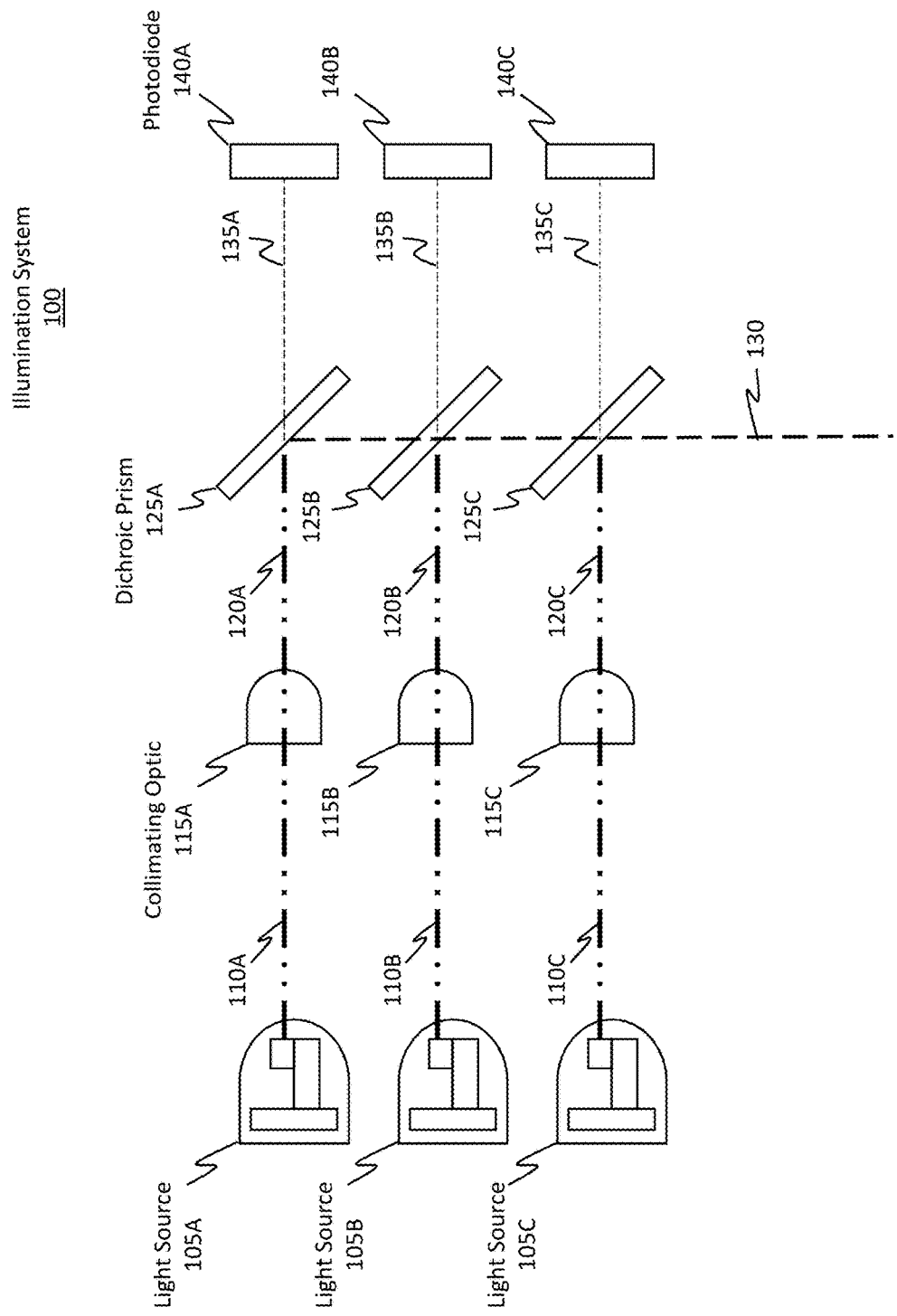
FIG. 1A illustrates a system that uses a beam combiner (e.g., a dichroic prism/mirror) to combine laser light, where a portion of the laser light is permitted to pass or leak through the beam combiner and be directed to one or more photodiode(s) that then measure an output of the laser emitters that emitted the laser light.

Embodiments disclosed herein relate to systems, methods, and devices that re-arrange the placement of a photodiode within an illumination system to achieve improved characteristics, design flexibility, and reduced form factor.

In some embodiments, an illumination system includes a laser assembly, a MEMS mirror system, a beam combiner, and a photodiode. The laser assembly includes RGB lasers. The MEMS mirror system redirects laser light produced by the RGB lasers to illuminate pixels in an image frame. The beam combiner combines the laser light. The photodiode is provided to determine a power output of the laser assembly by receiving/absorbing and measuring some of the laser light. The photodiode is also beneficially positioned between the laser assembly and the beam combiner.

In some embodiments, an illumination system includes a laser assembly that includes RGB lasers. The lasers are associated with at least one collimating optic, and each laser emits laser light (e.g., red laser light, green laser light, and blue laser light). The illumination system also includes a multi-section photodiode that includes a separate red section, green section, and blue section photodiode for absorbing and measuring absorbed portions of the red, green, and blue laser light. This absorbed light is used to determine a power output of the laser assembly. The illumination system further includes a beam combiner, which combines reflected portions of the red, green, and blue laser light to form combined laser light, and a MEMS mirror system that redirects the combined laser light to illuminate pixels in an image frame. The multi-section photodiode is positioned between the laser assembly and the beam combiner.

In some embodiments, an illumination system includes a laser assembly comprising RGB lasers that emit red, green, and blue laser light. The illumination system also includes collimating optics for collimating the red, green, and blue laser light. A photodiode absorbs and measures portions of the collimated red, green, and blue laser light. This absorbed light is used to determine a power output of the laser assembly. The illumination system further includes a beam combiner that combines other portions of the collimated red, green, and blue laser light to form combined laser light. A MEMS mirror system then redirects the combined laser light to illuminate pixels. The photodiode is positioned between the collimating optics and the beam combiner.

Technical Benefit(s)

The disclosed embodiments bring about substantial benefits to the technical field. In particular, the disclosed embodiments multi-purpose a photodiode by coating it with a highly reflective (HR) coating. This reflective coating allows some light to pass through it so the light can be absorbed by the photodiode, which can then determine the laser assembly's power output and other operational characteristics (e.g., lasing current threshold, slope efficiency, etc.). Additionally, the reflective coating is configured to reflect other portions of the light. By so doing, the photodiode is now a "reflective photodiode" capable of concurrently operating as both a photodiode and a turning optic (i.e. a device that reflects light out of plane relative to the direction of incident/incoming light). In this regard, the disclosed embodiments aggregate or combine multiple discrete units into a single unit, thereby reducing the amount of hardware provided within a laser-based system. Whereas previous systems relied on separate turning optics and separate photodiodes, the disclosed embodiments are able to beneficially combine these components into a single unit, thereby saving space and reducing costs.

The disclosed embodiments also improve the technical field by optimizing the placement of this improved reflective photodiode within an illumination system. For instance, because the photodiode now has dual or multiple purposes, it can now be placed at locations where it previously could not be placed. Enabling this reflective photodiode to be placed at multiple different locations allows for more flexibility in how the illumination system is designed. Increased design flexibility also helps reduce cost, reduce time spent in designing the system, and reduce constraints that were previously imposed on the illumination system. In this regard, the disclosed embodiments provide substantial, real-world practical applications and benefits to the technical field.

Additional benefits include the photodiode being able to be positioned within the system in order to provide feedback control for the laser device. That is, because laser performance changes over temperature and time, it is highly beneficial to continuously or periodically measure/determine the laser's performance by monitoring its power output and other parameters via the use of the photodiode. In doing so, the embodiments are able to accurately determine the laser's lasing current threshold (i.e. the point at which the laser will begin to lase) as well as its slope efficiency (i.e. the relationship between the laser's pump/drive current and its power output). As such, using the disclosed photodiode will result in a more accurate, robust, and reliable laser-based system. It will also enable independent monitoring and control of a laser assembly/emitter without significantly increasing the size of the laser-based system's package. As used herein, the terms "laser," "laser assembly," and "laser emitter" are interchangeable with one another.

Leaking Light Through a Beam Combiner

FIG. 1A illustrates an illumination system 100 in which light is leaked through a beam combiner (e.g., a dichroic prism/mirror) and absorbed by a photodiode, which is used to determine a laser's power output, as described earlier.

To illustrate, illumination system 100 includes light source 105A, light source 105B, and light source 105C.

Figure 1B:
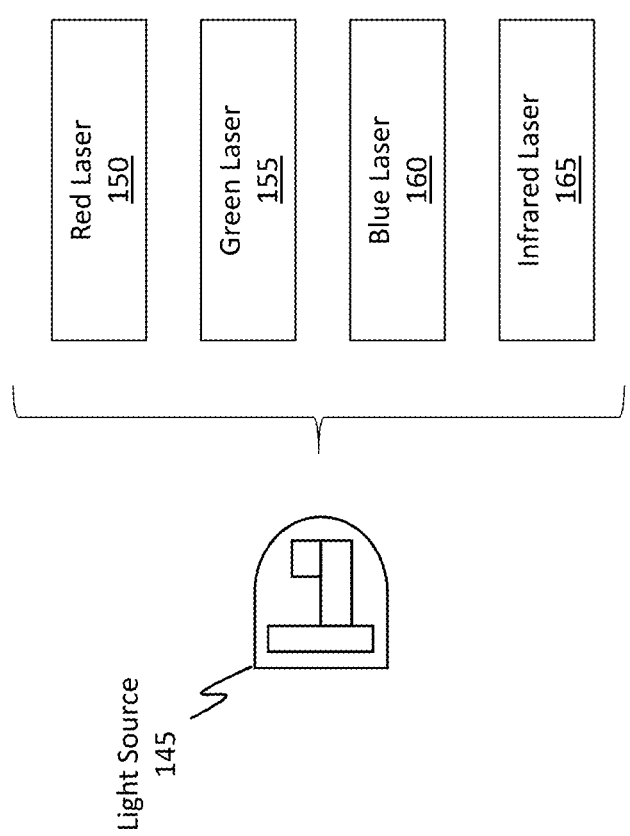
FIG. 1B illustrates how different light sources can be used with the MEMS mirror system, where the light sources can be red, green, blue, or infrared laser emitters/assemblies.

Turning briefly to FIG. 1B, light source 145, which is representative of light sources 105A, 105B, and 105C, may include different types of light sources. Examples include, but are not limited to, a red laser 150, a green laser 155, a blue laser 160, an infrared (IR) laser 165, or any combination of the above.

Returning to FIG. 1A, light sources 105A, 105B, and 105C are configured to emit light, such as light 110A, light 110B, and light 110C, respectively. Light 110A, 110B, and 110C then each pass through a corresponding collimation optic, as shown by collimation optic 115A, collimation optic 115B, and collimation optic 115C, thereby producing collimated light 120A, 120B, and 120C.

Illumination system 100 then includes a beam combiner in the form of dichroic prisms 125A, 125B, and 125C. Portions of collimated light 120A, 120B, and 120C reflect off of dichroic prisms 125A, 125B, and 125C and are spectrally/optically combined by the dichroic prisms 125A, 125B, and 125C to produce combined laser light 130.

Other portions of light (e.g., light portions 135A, 135B, and 135C) are leaked or passed through the dichroic prisms 125A, 125B, and 125C. These light portions 135A, 135B, and 135C are then absorbed by photodiodes 140A, 140B, and 140C, respectively. By absorbing light portions 135A, 135B, and 135C, the photodiodes 140A, 140B, and 140C are able to determine the power output and operational parameters of the light sources 105A, 105B, and 105C. In some embodiments, photodiodes 140A, 140B, and 140C include an anti-reflective (AR) coating that is configured to absorb some or all of the light presented to them. This determination allows the illumination system 100 to dynamically adjust or modify the output of the light sources 105A, 105B, and 105C to produce improved image quality or improved laser performance, especially in response to changes to lasing current threshold or slope efficiency.

The disclosed embodiments presented herein improve the architecture presented in FIG. 1A by multi-purposing a photodiode to operate as both a photodiode and a turning optic. As used herein, a "turning optic" refers to an optical device that is able to receive incident light and reflect or aim it at a different location. As will be described in more detail later, the reflected light may be reflected at any angle (e.g., acute and obtuse angles).

This improved photodiode is referred to herein as a "reflective photodiode." Use of this reflective photodiode allows an illumination system to position the photodiode at locations where it previously could not be placed. Furthermore, use of this reflective photodiode allows for a more compact laser-based system (e.g., because light can be reflected out of plane, the components can be packaged closer to one another), resulting in the benefits described earlier.

"Reflective Photodiode" Characteristics

Figure 2A:
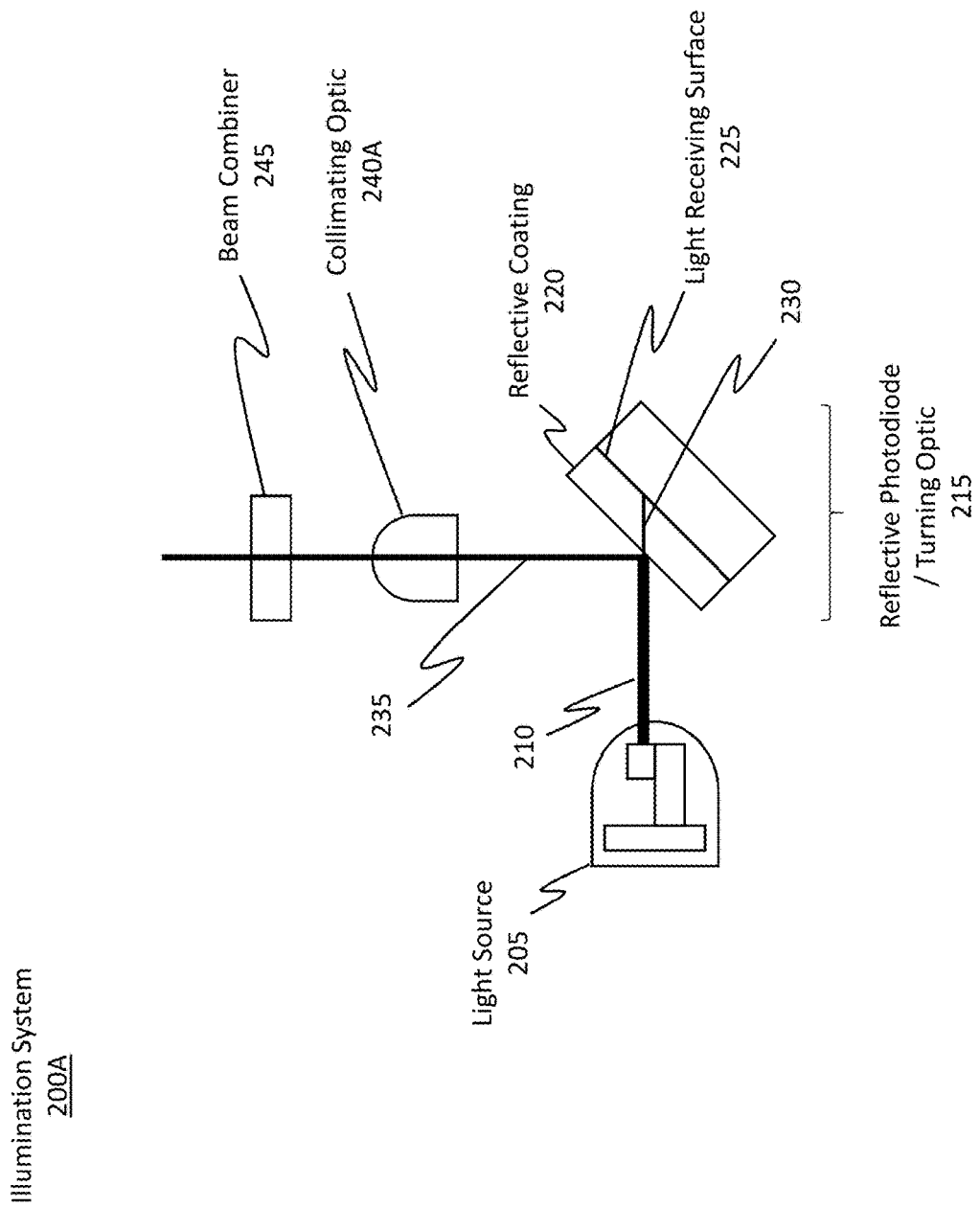
FIG. 2A illustrates an improved illumination system that re-purposes, or rather multi-purposes, a photodiode by configuring the photodiode to operate as a reflective photodiode that both (i) operates as a photodiode by absorbing laser light to determine an output of a laser emitter and (ii) operates as a turning optic by reflecting light.

FIG. 2A illustrates an improved type of illumination system 200A. Illumination system 200A includes a light source 205, which is representative of the light sources 105A, 105B, and 105C from FIG. 1A and light source 145 from FIG. 1B. Here, light source 205 is shown as emitting laser light 210.

As used herein, the term "laser light" should be interpreted broadly, unless specifically specified otherwise. For instance, laser light can include a single laser color (e.g., any one of a red, green, blue, or IR laser light). Laser light can also include multiple colors (e.g., any combination of red, green, blue, or IR light). Laser light can be generated by a single light source (e.g., a single laser emitter) or, in cases where the laser light is a combination of multiple colors, the laser light may be generated by multiple different light sources. In some cases, the laser light includes a single color, but multiple light sources were used to generate the laser light. Accordingly, as used herein, "laser light" should be interpreted broadly to cover any of multiple different types of laser light.

As shown, laser light 210 is being directed towards a reflective photodiode/turning optic 215. Reflective photodiode/turning optic 215 is shown as including a reflective coating 220 and a light receiving surface 225.

Here, the light receiving surface 225 is configured to absorb a first portion (e.g., light portion 230) of incoming light (e.g., laser light 210) that is directed at the reflective photodiode/turning optic 215 and to convert the first portion (e.g., light portion 230) of incoming light into electrical current. To clarify, a photodiode is a type of semiconductor device that converts light into an electrical current. This electrical current is generated by the semiconductor device when light (or rather photons) is absorbed on the photodiode's light receiving surface (e.g., light receiving surface 225). A photodiode includes a p-n junction. When a photon strikes or hits the photodiode, then an electron-hole pair is formed within the p-n junction, creating a photoelectric effect. Holes move towards the p-n junction's anode while the electrons move toward the p-n junction's cathode, thereby creating a photocurrent. Accordingly, reflective photodiode/turning optic 215 is able to convert light into electrical current. As will be described in more detail later, this electrical current is used to measure the operational characteristics (e.g., lasing current threshold, slope efficiency, power output, etc.) of the light source 205. Furthermore, the measurements and analysis of the electrical current can be provided as feedback to the light source 205 in order to more accurately control the operations of light source 205.

Reflective coating 220, which is coated over-top-of or disposed over-top-of (or on) the light receiving surface 225, may be any type of reflective coating capable of reflecting light while also allowing at least some of the light to pass through it. It will be appreciated, therefore, that reflective coating 220 (i.e. a type of high reflective coating) is distinctive from the anti-reflective coating that may be present on photodiodes 140A, 140B, and 140C from FIG. 1A. For instance, FIG. 2A shows how light portion 230 leaks or otherwise passes through reflective coating 220. FIG. 2A also shows how reflected light 235 is reflected off of the reflective coating 220. As such, reflective coating 220 is able to simultaneously reflect light and allow light to pass through it. Accordingly, reflective coating 220 is configured to reflect a second portion (e.g., reflected light 235) of the incoming light (e.g., laser light 210) away from the light receiving surface 225 while permitting the first portion (e.g., light portion 230) of the incoming light to pass through the reflective coating 220 and to be absorbed by the light receiving surface 225.

In some cases, reflective coating 220 is configured to reflect at least 80% of the incoming/incident light (i.e. reflected light 235 constitutes 80% of the laser light 210, which has been reflected). In some cases, reflective coating 220 is configured to reflect at least 90% of the incoming/incident light. In some cases, reflective coating 220 is configured to reflect at least 95%, 96%, 97%, 98%, or even 99% of the incoming/incident light. In this regard, the second portion (i.e. reflected light 235) of the incoming light (i.e. laser light 210) constitutes a majority of the incoming/incident light such that the majority of the incoming light is reflected by the reflective coating 220 while the first portion (i.e. light portion 230), which passes through the reflective coating 220 and which is absorbed by the light receiving surface 225, constitutes a minority of the incoming light. Accordingly, reflective photodiode/turning optic 215 reflects a majority of the laser light generated by light source 205 while permitting a minority of the laser light to be absorbed by its light receiving surface 225. Relatedly, in some instances, the first portion (e.g., light portion 230) of the incoming light that is absorbed by the light receiving surface 225 is less than 20%, 10%, 5%, or even about 3% of the incoming light.

Reflective photodiode/turning optic 215 is labeled as being both a photodiode and a turning optic as a result of it having multiple functions or purposes (e.g., reflection and absorption). FIG. 2A also shows reflective photodiode/turning optic 215 reflecting laser light 210 at about a 90-degree angle. It will be appreciated, however, that the light may be reflected at any angle and is not limited to a 90-degree angle. For instance, the light may be reflected at any acute angle (e.g., between 0 degrees and 90 degrees) or at any obtuse angle (e.g., greater than 90 degrees). As such, the embodiments are able to reflect light at any angle and are not limited to any particular angle or configuration. Accordingly, reflective photodiode/turning optic 215 constitutes a type of turning optic that reflects at least a portion of incoming light to a different direction.

FIG. 2A also shows that the illumination system 200A includes a collimating optic 240A and a beam combiner 245 (e.g., perhaps a dichroic prism/mirror). Reflected light 235 is shown as being reflected off of reflective coating 220 and being directed or aimed at collimating optic 240A.

A collimating optic (e.g., collimating optic 240A) is a type of optical device that narrows a light beam. This narrowing effect is achieved by either aligning light rays to follow a particular direction (e.g., to cause the rays to be parallel or somewhat parallel) and/or to cause the spatial cross section of the light beam to become relatively smaller.

After the reflected light 235 passes through the collimating optic 240A, then it is shown as striking beam combiner 245. Beam combiner 245 (e.g., a dichroic prism/mirror) is another type of optical device. This optical device is capable of combining the light rays from multiple different light beams in order to form a single light beam. As an example, beam combiner 245 is able to combine the laser light from any combination of a red laser, a green laser, and a blue laser to form combined RGB light. It can also combine RGB light with IR light. Therefore, while beam combiner 245 is not shown in FIG. 2A as combining multiple beams of light, it will be appreciated that beam combiner 245 is able to combine light (e.g., as shown by dichroic prisms 125A, 125B, and 125C (i.e. types of beam combiners) in FIG. 1A).

Flexible Placement of the Reflective Photodiode within an Illumination System

As a result of having multiple functionalities or multiple purposes, reflective photodiode/turning optic 215 can now be placed at numerous different locations within illumination system 200A. FIG. 2A shows one example placement.

Here, reflective photodiode/turning optic 215 is positioned upstream of the beam combiner 245 such that reflective photodiode/turning optic 215 is positioned between the light source 205 (e.g., a type of laser assembly/emitter) and the beam combiner 245 relative to a path of light emitted from the light source 205 towards the beam combiner 245. FIG. 2A also shows that the reflective photodiode/turning optic 215 is positioned upstream of the collimating optic 240A such that the reflective photodiode/turning optic 215 is positioned between the light source 205 and the collimating optic 240A relative to a path of light emitted from the light source 205 towards the collimating optic 240A.

As a result of being positioned upstream of the collimating optic 240A, the reflective photodiode/turning optic 215 is positioned at a pre-collimation location within the illumination system 200A. Consequently, the laser light is collimated after being received at, or reflected by, the reflective photodiode/turning optic 215.

Figure 2B:
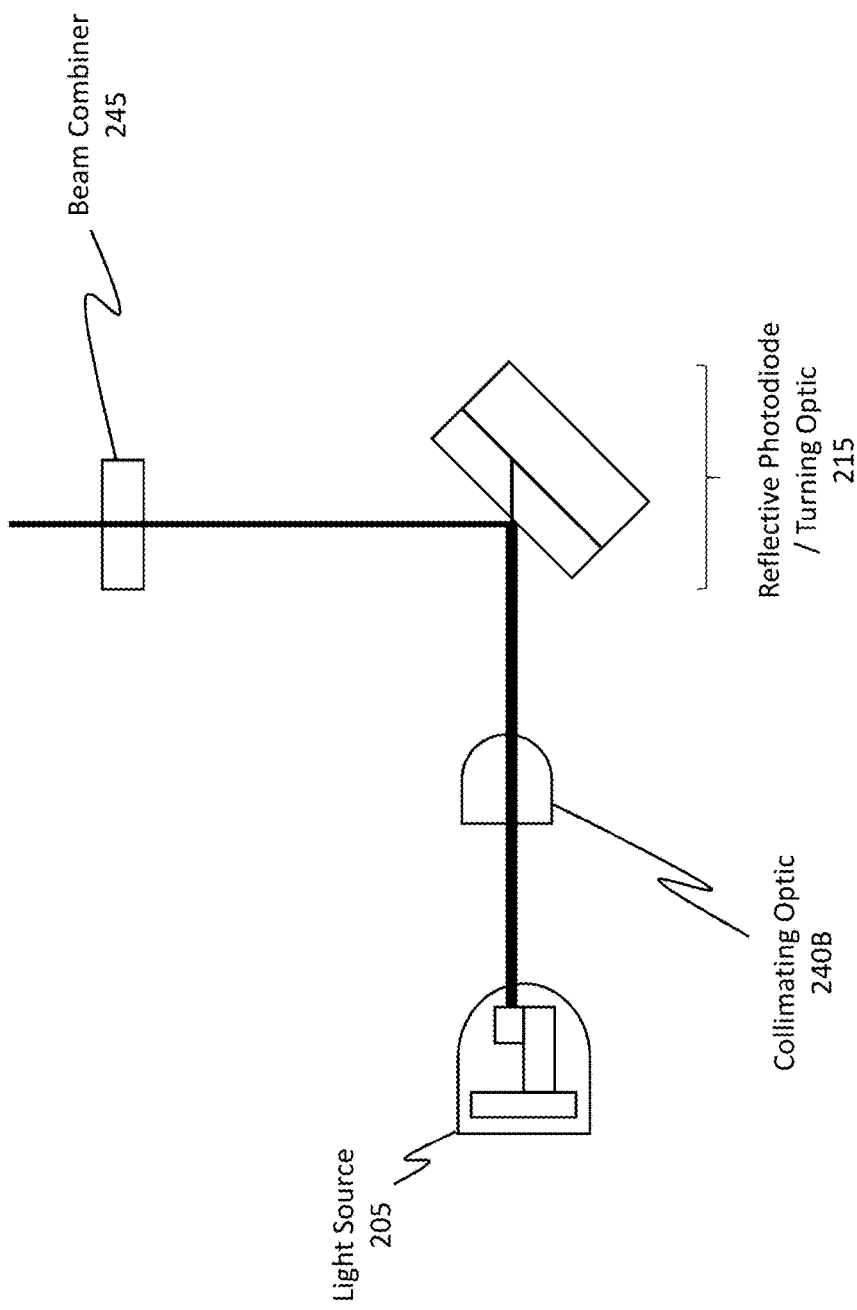
FIG. 2B illustrates how the reflective photodiode may be positioned within the illumination system between a collimating optic and a beam combiner.

FIG. 2B shows another example placement location for the improved reflective photodiode within an illumination system 200B. Specifically, FIG. 2B again shows the light source 205, a collimating optic 240B (which is representative of the collimating optic 240A from FIG. 2A but now positioned at a new location), the reflective photodiode/turning optic 215, and the beam combiner 245. Here, the reflective photodiode/turning optic 215 is positioned downstream of the collimating optic 240B and upstream of the beam combiner 245. That is, the reflective photodiode/turning optic 215 is positioned between the collimating optic 240B and the beam combiner 245.

As a result of being positioned downstream of the collimating optic 240B, the reflective photodiode/turning optic 215 is positioned at a post-collimation location within the illumination system 200B. Consequently, the laser light is collimated prior to being received at, or reflected by, the reflective photodiode/turning optic 215.

Figure 2C:
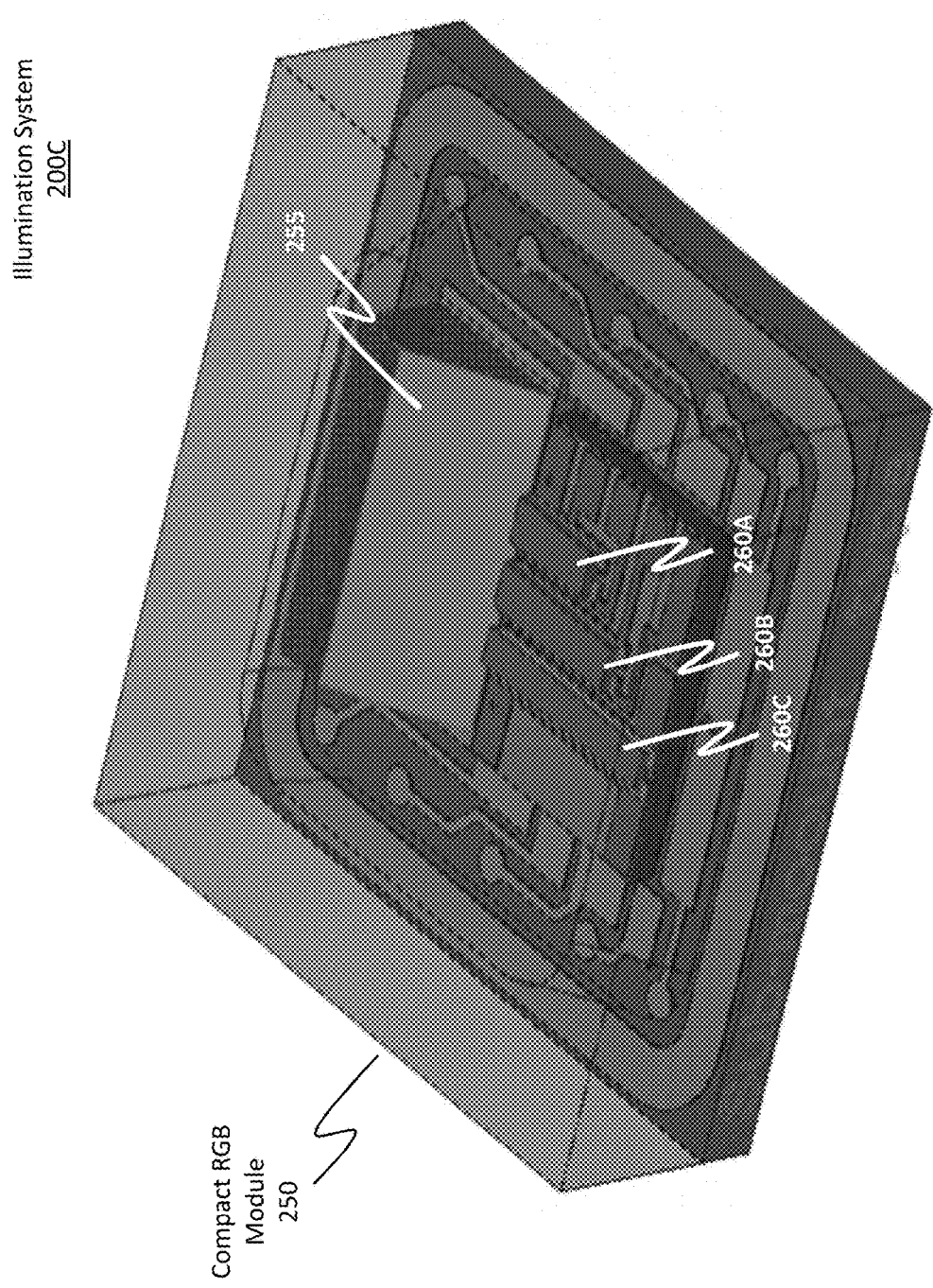
FIG. 2C illustrates a compact RGB module with a turning optic. Here, the photodiode/turning optic combination can individually sample the red, green, and blue laser colors, or, alternatively, a single photodiode/turning optic combination may be provided to sample all laser colors.

FIG. 2C provides an example illustration of another illumination system 200C that includes a compact RGB module 250. Compact RGB module 250 includes a reflective photodiode 255 and multiple different light sources (e.g., light sources 260A, 260B, and 260C), which are representative of the reflective photodiodes and light sources discussed earlier. With this compact arrangement or profile, the reflective photodiode 255 can individually sample red color laser light, green color laser light, and/or blue color laser light. Alternatively, the reflective photodiode 255 may jointly or concurrently sample all of the laser light colors.

Figure 2D:
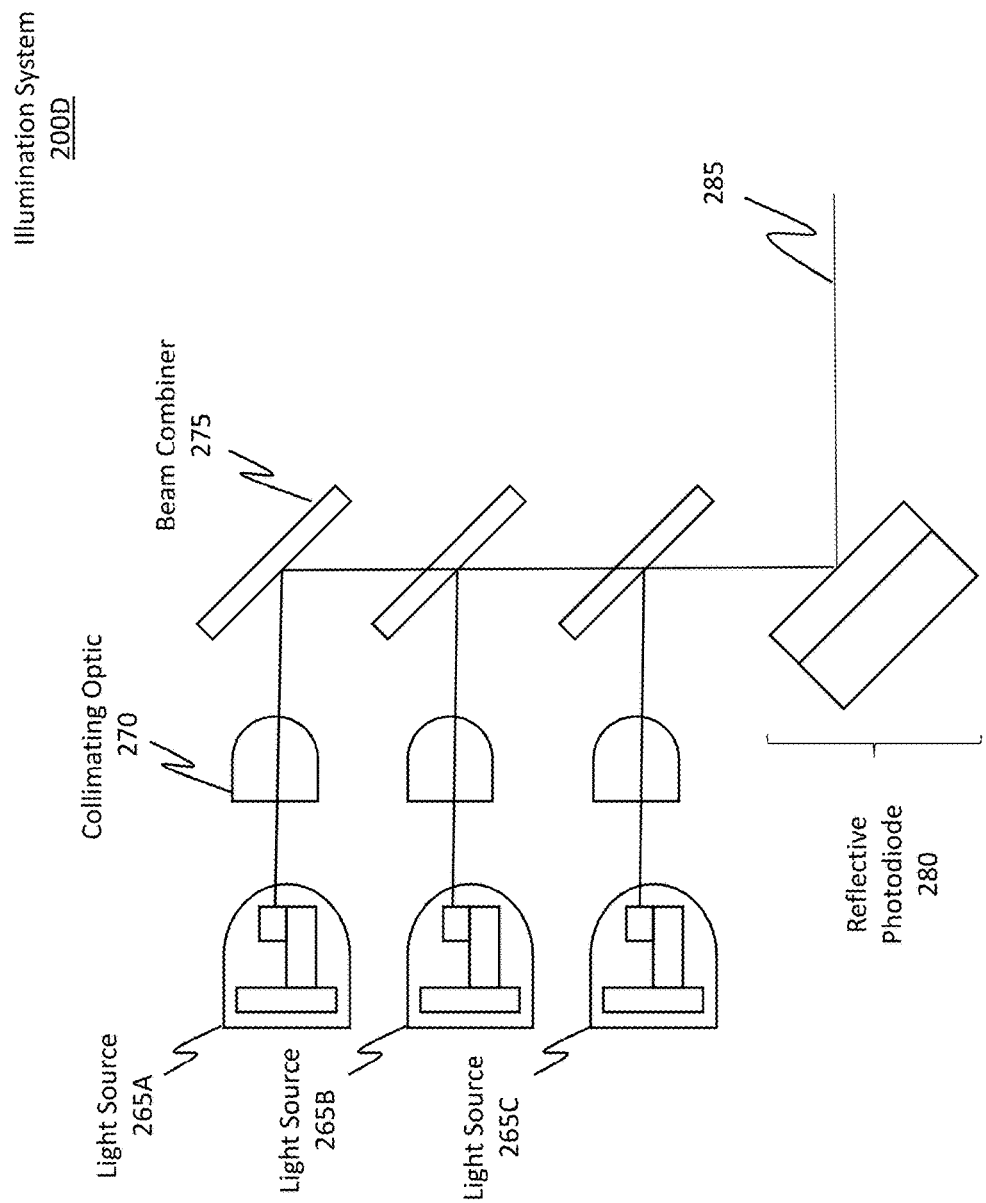
FIG. 2D illustrates another example arrangement/placement of the reflective photodiode, where the reflective photodiode is positioned downstream of both the collimating optic(s) and the beam combiner(s).

FIG. 2D illustrates yet another example configuration for an illumination system 200D. Illumination system 200D includes light sources 265A, 265B, and 265C, a collimating optic 270 (more are illustrated but not labeled for brevity purposes), a beam combiner 275 (again more are illustrated but not labeled), and a reflective photodiode 280. In this scenario, the reflective photodiode 280 is positioned downstream of the collimating optic 270 and downstream of the beam combiner 275. In this regard, illumination system 200D is somewhat similar to illumination system 100, but illumination system 200D now includes the improved reflective photodiode. FIG. 2D also shows how the reflective photodiode 280 is able to reflect light in the form of reflected light 285. Reflected light 285 can be directed towards any other downstream component or entity (e.g., a MEMS mirror system, to be discussed later).

Figure 2E:
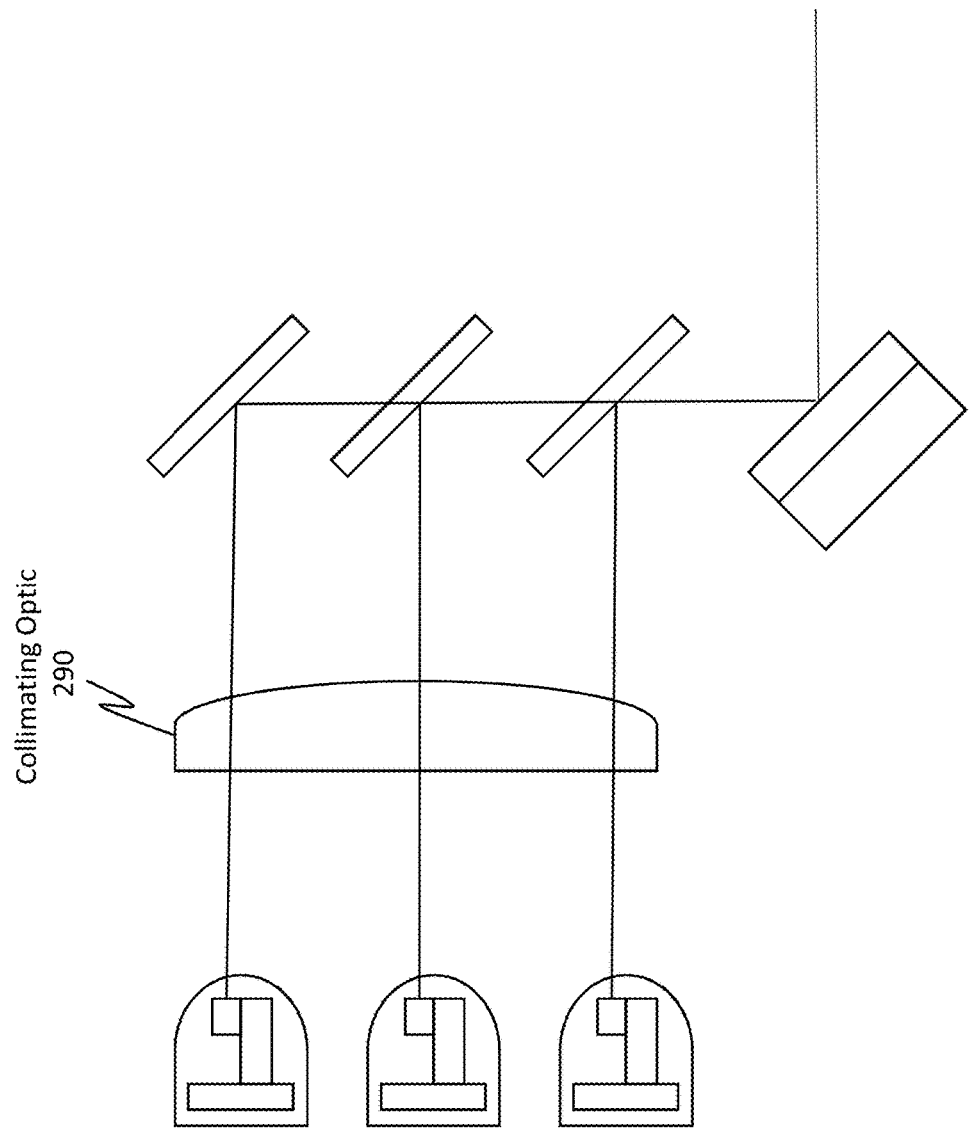
FIG. 2E illustrates a scenario in which a single collimating optic is provided to concurrently collimate the laser light from multiple different light sources.

While some of the earlier figures illustrated scenarios in which each red, green, and blue laser was associated with its own corresponding collimating optic, that may not always be the case. For instance, FIG. 2E shows a scenario in which a single collimating optic 290 is provided to jointly or concurrently collimate the laser light from multiple different light sources. As such, some embodiments are structured to include multiple collimating optics (e.g., one for each light source) while other embodiments are structured to include a single collimating optic that collimates light for multiple light sources.

Accordingly, as a result of multi-purposing a photodiode to operate as both a photodiode and a turning optic, the improved reflective photodiode can be beneficially/flexibly placed at multiple locations within an illumination system. This increased flexibility provides a more robust and dynamic system capable of adapting to many different scenarios.

Light Properties and Attributes of the Reflective Photodiode

Figure 3A:
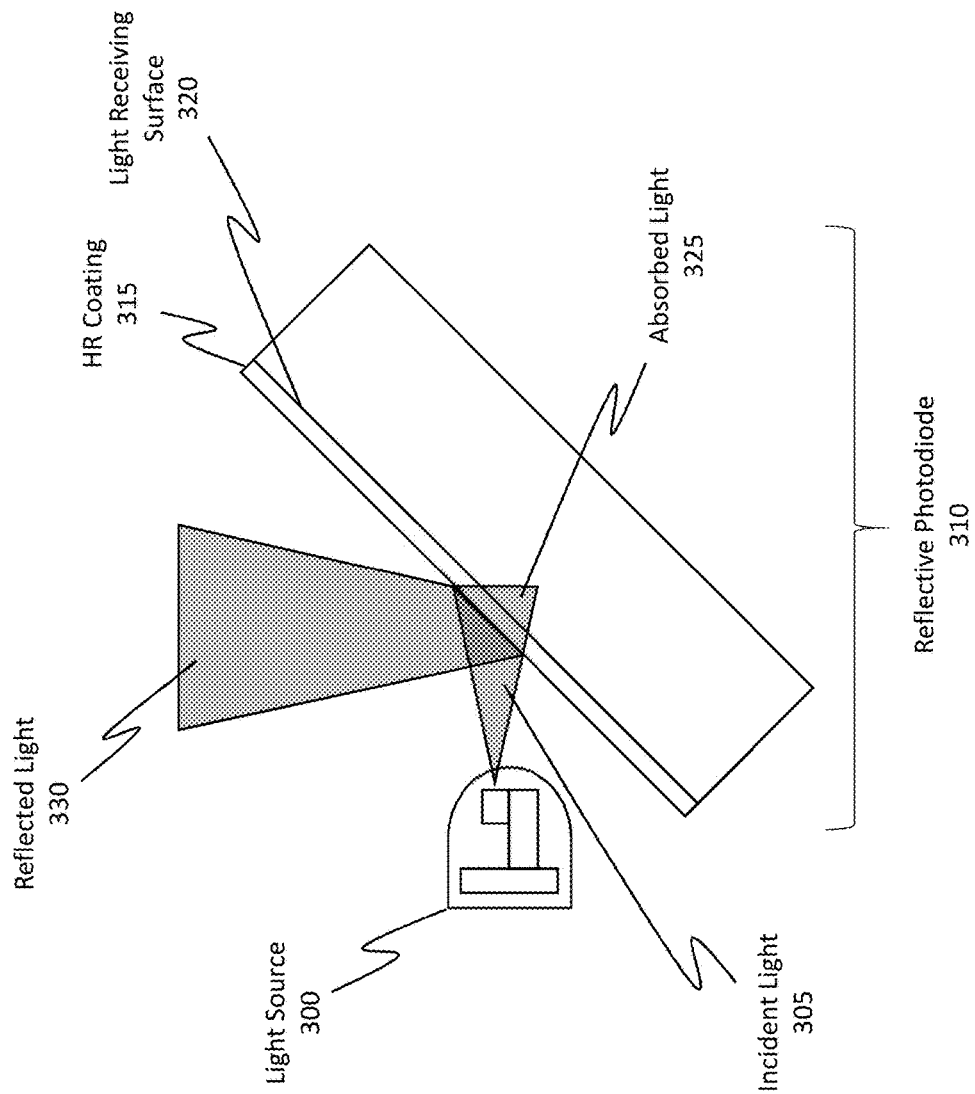
FIG. 3A illustrates how the reflective photodiode includes a highly reflective (HR) coating and a light receiving surface, where the HR coating is configured to reflect light while the light receiving surface is configured to absorb and measure light.

Attention will now be directed to FIG. 3A, which initially shows a light source 300 that is representative of any of the earlier light sources discussed thus far. Here, light source 300 is shown as projecting a beam or ray of light in the form of incident light 305. Incident light 305 is being directed towards reflective photodiode 310, which is representative of the earlier reflective photodiodes.

The size of incident light 305 can be deigned to accommodate any desired parameter or specification. In some cases, the size of incident light 305 (e.g., when it is received at reflective photodiode 310) is within a range spanning 50 μm and 3 mm.

It will also be appreciated that incident light 305 can be any type of light. For instance, incident light 305 can be red laser light, green laser light, blue laser light, and even infrared laser light, or any combination of the above. As such, the red, green, blue, and IR light can be structured to span the range between 50 μm and 3 mm. Additionally, the incident light 305 can be combined light that combines multiple colors. The combined light may also be in the range specified above.

It will be appreciated that the disclosed reflective photodiodes may be provided within a compact package or unit. Having a small, compact reflective photodiode is beneficial for high frequency monitoring of the incident light. For instance, smaller reflective photodiodes allow for smaller capacitance in the unit. Smaller capacitance allows for faster monitoring of the incident light.

FIG. 3A also shows how the reflective photodiode 310 includes a highly reflective (HR) coating 315 and a light receiving surface 320, which are representative of the HR coatings and light receiving surfaces discussed earlier. When incident light 305 strikes the HR coating 315, a portion of the incident light 305 will pass or leak through the HR coating and will be absorbed, measured, or otherwise received at the light receiving surface 320 in the form of absorbed light 325.

Another portion of the incident light 305 will be reflected away from both the HR coating 315 and the light receiving surface 320 in the form of reflected light 330. It will be appreciated that the HR coating 315 can reflect light spanning a large bandwidth. That is, HR coating 315 is highly versatile and is able to beneficially reflect numerous different types of light waves spanning many different wavelengths or bandwidths while simultaneously allowing a sufficient amount of leaked light to pass through it for laser monitoring and control.

Figure 3B:
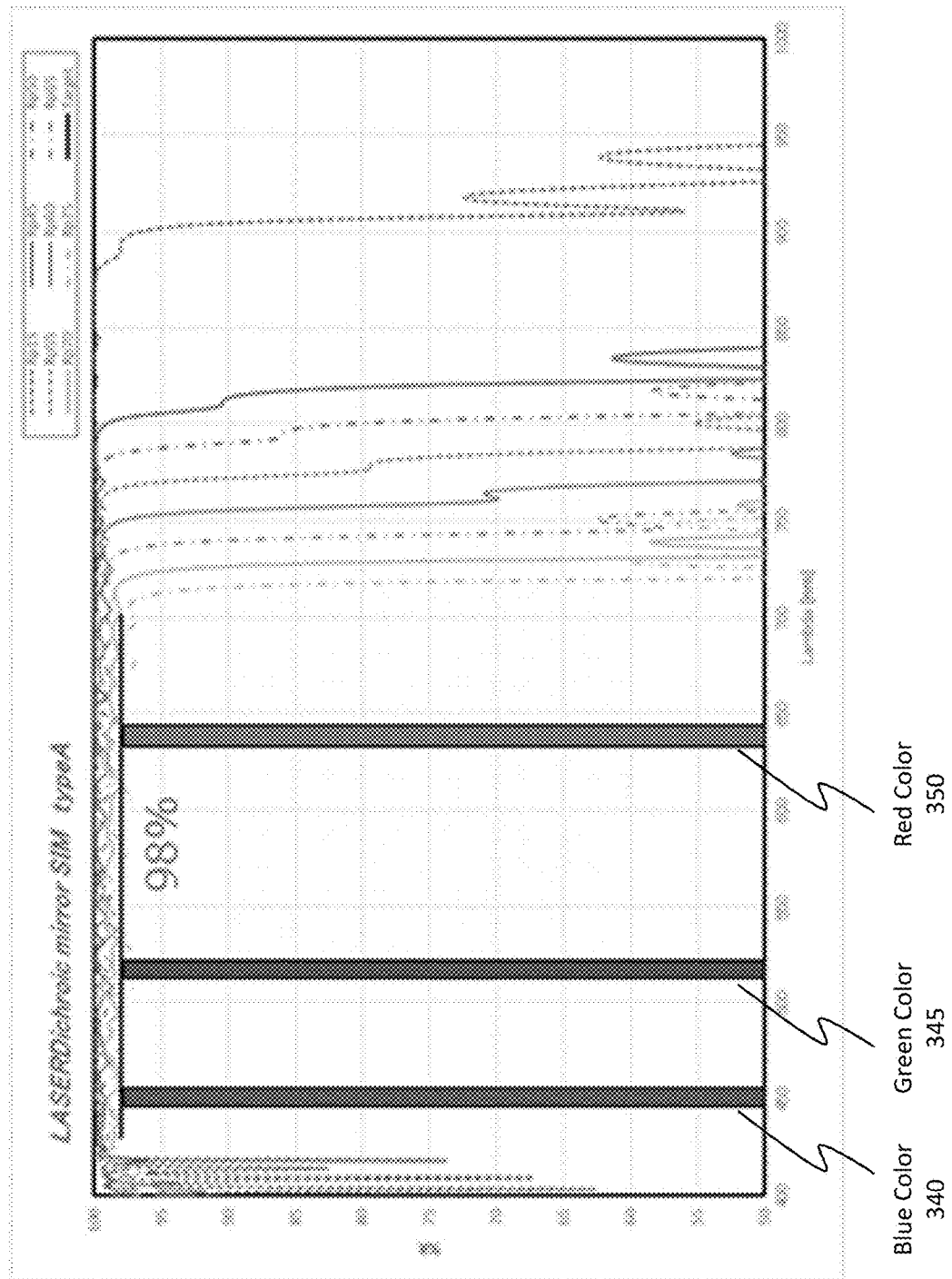
FIG. 3B illustrates a sample measurement of the reflectivity properties for the reflective coating of a reflective photodiode.

Turning briefly to FIG. 3B, this figure illustrates a sample reflectivity measurement 335 of the reflective coating (e.g., HR coating 315 from FIG. 3A) on a reflective photodiode. FIG. 3B shows the sample reflectivity for blue color laser light 340, green color laser light 345, and red color laser light 350 as used within a reflective photodiode in accordance with the disclosed embodiments. FIG. 3B also shows how the reflective surface of the reflective photodiode allows a high percentage (e.g., FIG. 3B indicates that in some cases, the percentage can be around 98%) of the light to be reflected away. Consequently, a much lower percentage (e.g., around 2%) of the light is absorbed by the reflective photodiode.

Returning to FIG. 3A, in cases where the incident light 305 is red laser light, green laser light, blue laser light, infrared laser light, or any combination of the above, reflective photodiode 310 is able to reflect and/or absorb portions of the red, green, blue, and infrared laser light (either before being collimated or after being collimated and either before being beam combined or after being beam combined). The reflected portions of the red, green, blue, or infrared laser light can be within the ranges discussed earlier (e.g., 80%, 90%, 95%, 96%, 97%, 98%, 99% or more than 99%) and the absorbed portions of the red, green, blue, or infrared laser light can be within the other ranges discussed earlier (e.g., less than 20%, 10%, 5%, 4%, 3%, or even less than 2% such as 1% or even less than 1%).

Multi-Section Reflective Photodiode

Figure 4:
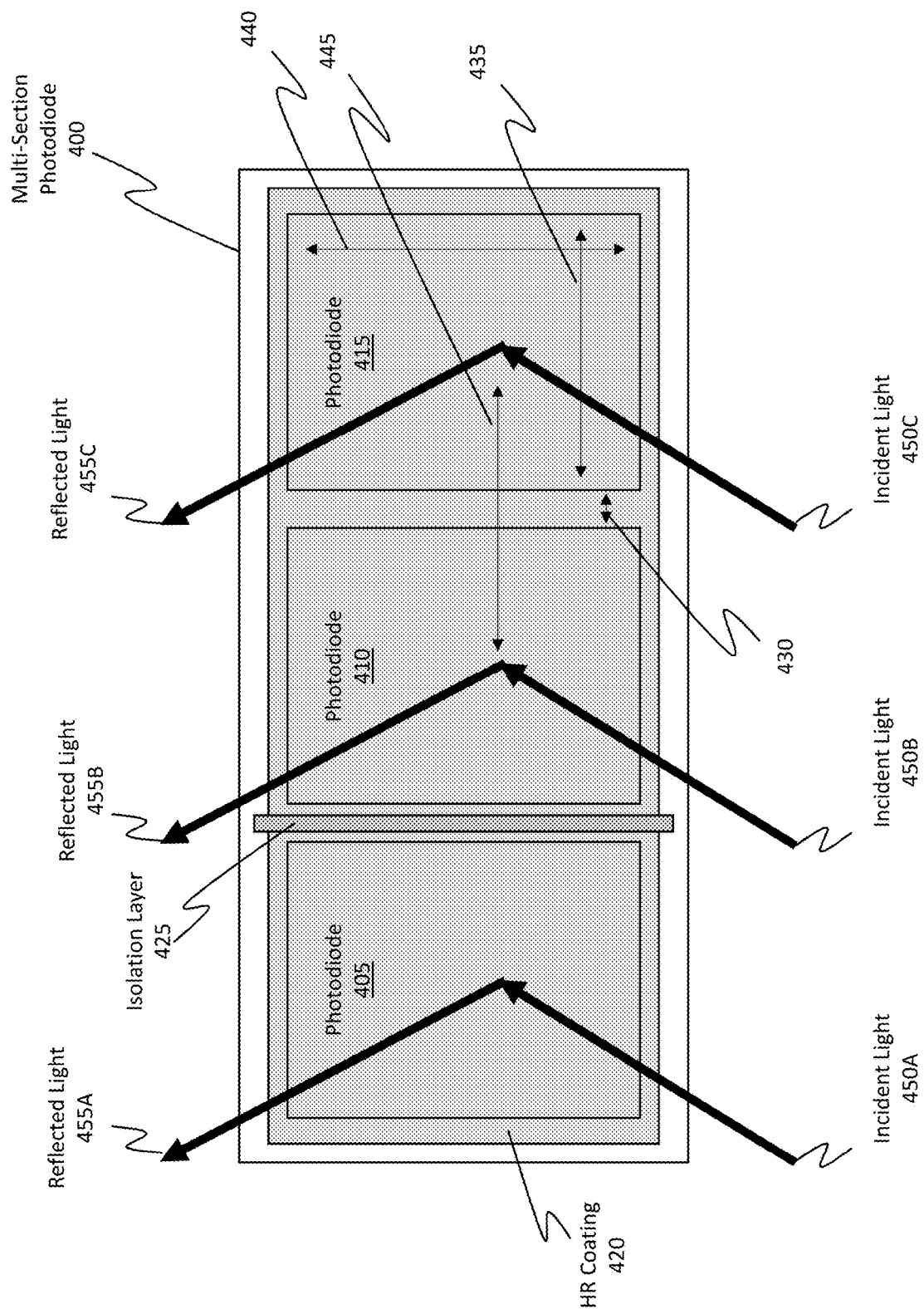
FIG. 4 illustrates a multi-section reflective photodiode that includes multiple photodiode sections, where each section is able to simultaneously receive a corresponding incident beam of light.

In some cases, the reflective photodiode may be configured to receive a single ray/beam of light, where the single ray of light includes a single color or multiple colors (e.g., RGB and IR laser light). In other cases, the reflective photodiode may be configured to simultaneously or concurrently receive multiple discrete rays of light, where each one of the different rays of light can be a single color or a combination of multiple colors. FIG. 4 shows an example scenario in which a reflective photodiode is specially configured to simultaneously receive and reflect multiple different rays of light.

Specifically, FIG. 4 shows a multi-section photodiode 400 that includes a first section photodiode 405, a second section photodiode 410, and a third section photodiode 415. In some implementations, multi-section photodiode 400 includes a red section photodiode (e.g., first section photodiode 405) for absorbing and measuring a first portion of red laser light, a green section photodiode (e.g., second section photodiode 410) for absorbing and measuring a first portion of green laser light, and a blue section photodiode (e.g., third section photodiode 415) for absorbing and measuring a first portion of blue laser light.

While FIG. 4 shows that multi-section photodiode 400 includes three separate sections, it will be appreciated that multi-section photodiode 400 may be equipped or designed to include any number of different sections. As an example, multi-section photodiode 400 may include 2 sections, 3 sections, 4 sections, 5 sections, and more than 5 sections. Furthermore, each section may be configured to absorb and measure a single-color ray of light or, alternatively, each section may be configured to absorb and measure rays of light having multiple colors. In some implementations, one section may absorb one color of light while another section may simultaneously absorb multiple colors of light. From this, it will be appreciated that the different sections can be fabricated in numerous ways and can be designed to accommodate many different applications.

FIG. 4 also shows how multi-section photodiode 400 includes a HR coating 420, which is representative of the HR coatings discussed earlier. In this case, there is a single HR coating 420 uniformly covering all of the sections, but that may not always be the case. For instance, in some implementations, each section may have its own separate HR coating such that the different HR coatings are separated or isolated from one another. In some implementations, an HR coating may uniformly cover 1, 2, 3, 4, etc. photodiode sections while a separate HR coating may uniformly cover 1, 2, 3, 4, etc. photodiode sections on the same multi-section photodiode.

FIG. 4 also shows that in some cases, an isolation layer 425 may be provided between each one of the sections. For instance, isolation layer 425 is positioned between first section photodiode 405 and second section photodiode 410. Isolation layer 425 may be provided to ensure electrical isolation or insulation between the different photodiode sections. In some cases, isolation layer 425 may be an etched portion of the multi-section photodiode 400, where the etching provides electrical isolation. In other cases, isolation layer 425 may be a dielectric layer or other type of isolation material that provides electrical isolation. In other cases, the isolation layer 425 can be a metal layer that blocks light between the photodiode sections.

It will also be appreciated that the dimensions of multi-section photodiode 400 can be configured to suite any desired specification. As an example, the separation distance 430 between the different photodiode sections can be set to any desired value. A typical value for separation distance 430 is around 0.05 mm, though this value can vary as needed or desired. In some cases, separation distance 430 can vary within a range of 0.01 mm up to 0.1 mm. Furthermore, the separation distance between different photodiode sections can be different, even on the same multi-section photodiode 400. As an example, separation distance 430 is the distance between second section photodiode 410 and third section photodiode 415. In one example, separation distance 430 can be 0.05 mm. In contrast, the separation distance between first section photodiode 405 and second section photodiode 410 can be a different value (e.g., perhaps 0.04 mm or 0.06 mm). Accordingly, the separation distances can vary, even across different photodiode sections on the same multi-section photodiode.

The dimensions of each respective photodiode section can also be set or designed to any value. For instance, width 435 and length 440 of each photodiode section can be set to any designed value. An example value for width 435 is around 0.3 mm and an example value for length 440 is around 2.00 mm. Of course, other values may be used as well. For instance, width 435 may span any value in the range of 0.1 mm to 1.0 mm, and length 440 may span any value in the range of 1.00 mm and 4.00 mm. Similar to the earlier discussion, different photodiode sections may have different dimensions, even though they are placed on the same multi-section photodiode (e.g., one section may be 0.3 mm by 2.00 mm while another section on the same multi-section photodiode may be 0.1 mm by 1.00 mm).

Pitch 445 represents the distance between congruent points on neighboring photodiode sections. For instance, pitch 445 is shown as being the distance between one point on second section photodiode 410 and a corresponding point on third section photodiode 415. Pitch 445 may be any value, but one example value is around 0.35 mm. In some cases, pitch 445 may be any value spanning the range between 0.1 mm and 4.0 mm.

FIG. 4 shows how incident light 450A is striking first section photodiode 405, incident light 450B is striking second section photodiode 410, and incident light 450C is striking third section photodiode 415. The HR coating 420 allows some light to be absorbed by the underlying respective photodiode sections while the remaining light is reflected. For instance, reflected light 455A is the light reflected off of first section photodiode 405, reflected light 455B is the light reflected off of second section photodiode 410, and reflected light 455C is the light reflected off of third section photodiode 415.

It will be appreciated that multi-section photodiode 400 may be representative of any of the reflective photodiodes/turning optics discussed previously. Specifically, multi-section photodiode 400 may be positioned at any of the locations described earlier, such as, but not limited to, being positioned before or after collimating optics and before or after beam combiners. Accordingly, the disclosed embodiments are able to provide a highly flexible arrangement or placement configuration with regard to the multi-section photodiode.

Feedback Control of the Laser Assembly/Emitter

Figure 5A:
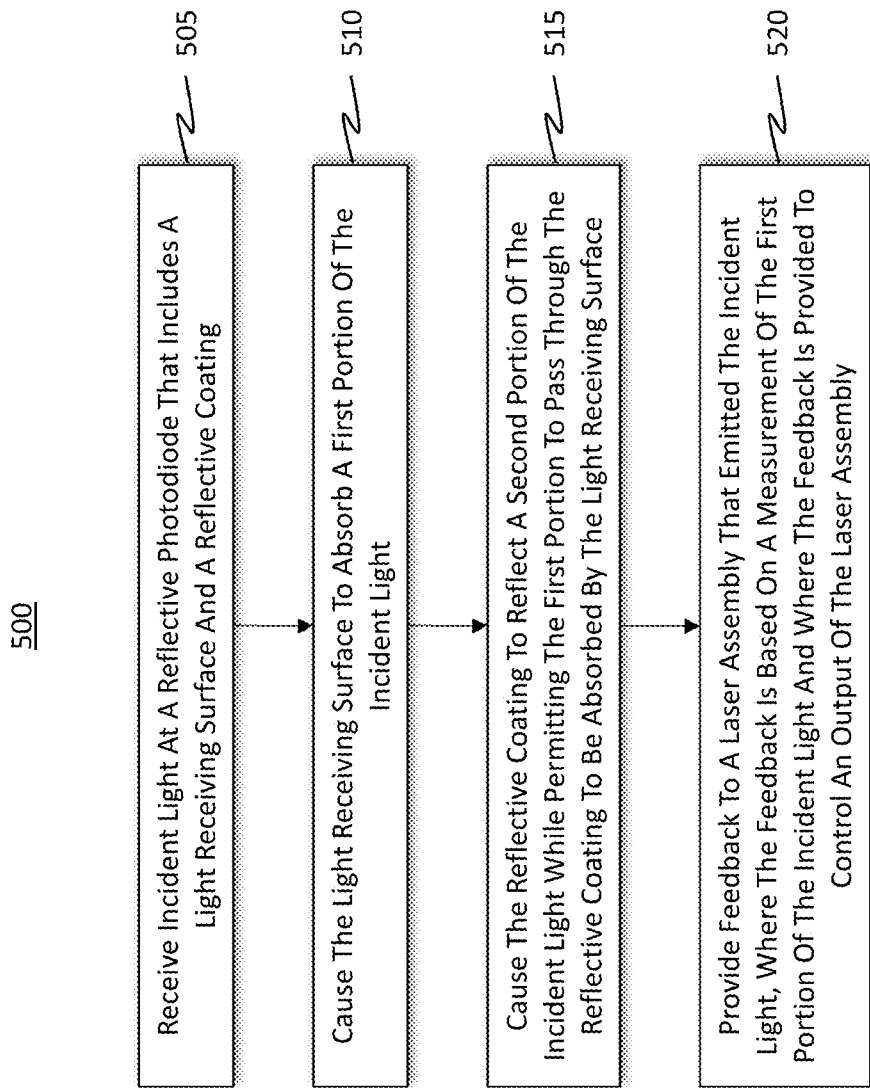
FIG. 5A illustrates a flowchart of an example method for providing feedback to a laser (e.g., a light source) based on light measurements determined by a reflective photodiode, where the light measurements are able to accurately determine operational characteristics of the laser (e.g., the lasing current threshold and slope efficiency) and the feedback is provided to more accurately control operations of the laser based on the operational characteristics.

Attention will now be directed to FIG. 5A which refers to a number of method acts that may be performed. Although the method acts may be discussed in a certain order or illustrated in a flow chart as occurring in a particular order, no particular ordering is required unless specifically stated or required because an act is dependent on another act being completed prior to the act being performed.

FIG. 5A shows a flowchart of an example method 500 for dynamically (in real-time) controlling the output of a laser emitter through the use of feedback provided by a reflective photodiode. That is, because laser performance changes over temperature and time, it is highly beneficial to continuously or periodically measure/determine the laser's performance by monitoring its power output and operational characteristics/parameters/attributes via the use of the photodiode. In doing so, the embodiments are able to accurately determine the laser's lasing current threshold (i.e. the point at which the laser will begin to lase) as well as its slope efficiency (i.e. the relationship between the laser's pump/drive current and its power output). Initially, method 500 includes an act 505 of receiving incident light at a reflective photodiode (e.g., those discussed throughout this disclosure) that includes a light receiving surface and a reflecting coating, as described earlier. The reflective photodiode can be a single section reflective photodiode or a multi-section reflective photodiode. Additionally, the received light can be generated by a single laser or multiple lasers. Furthermore, the received light can be a single color or it can be multiple colors.

Method 500 then includes an act 510 of causing the light receiving surface to absorb a first portion of the incident light. For instance, the p-n junction of the photodiode can absorb the light as described earlier in order to generate a photocurrent.

Act 515 includes a process of causing the reflective coating to reflect a second portion of the incident light while permitting the first portion to pass through the reflective coating to be absorbed by the light receiving surface.

Then, method 500 includes an act 520 of providing feedback to a laser assembly that emitted the incident light. For instance, the reflective photodiode is able to absorb light and convert the light into an electrical current. By absorbing the light, the photodiode is able to determine a current/instant power output and operational characteristics of the laser assembly. Determining the power output is particularly beneficial because it allows for reconfiguring, calibrating, or readjusting of the laser's power output or other operations, as need.

Figure 5B:
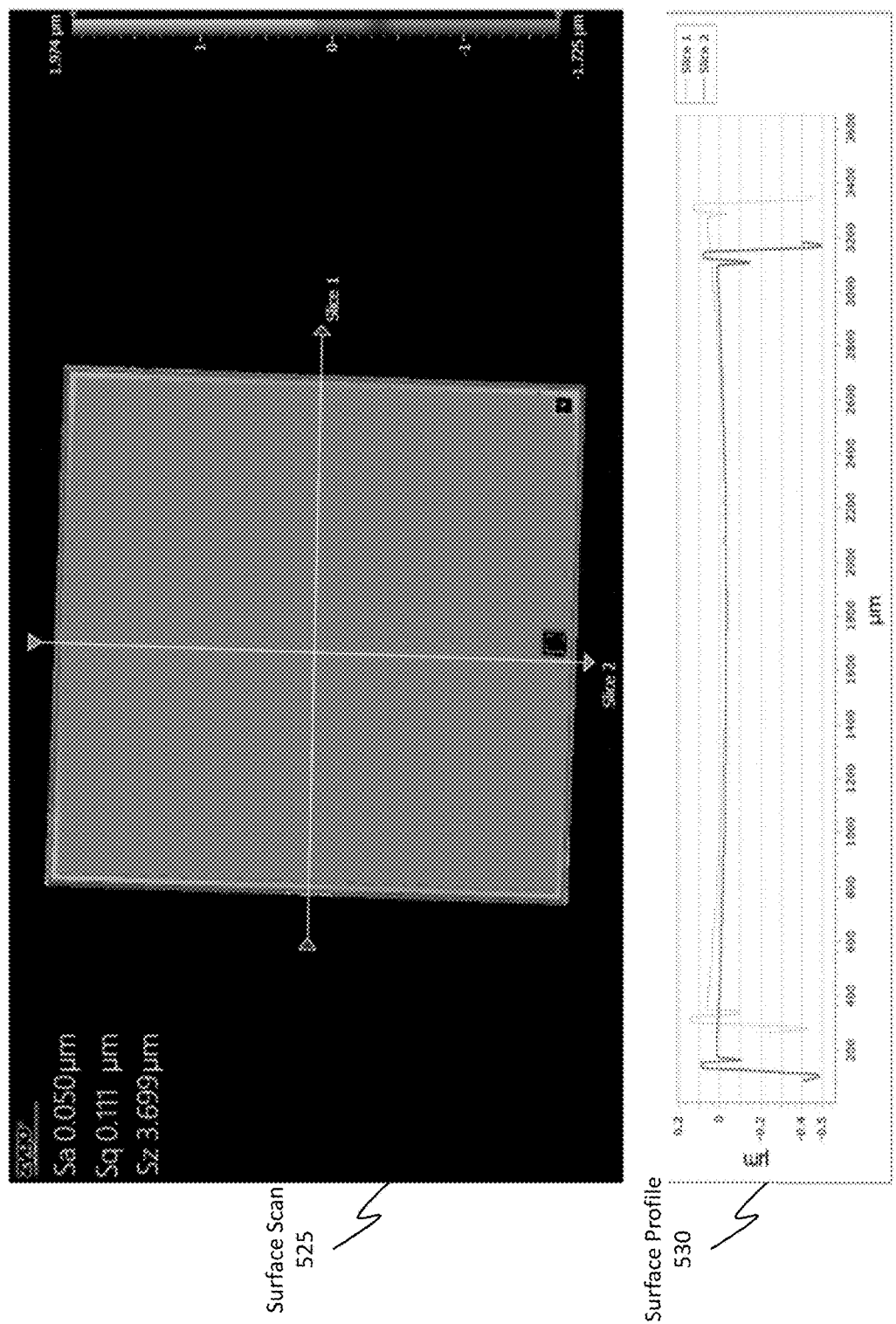
FIG. 5B illustrates how the optical flatness of the reflective photodiodes is very flat and how the surface roughness of the reflective photodiodes is very low. Having flat optical flatness and low surface roughness allows the reflective photodiode to exhibit highly beneficial reflective properties, thus allowing it to operate as a turning optic.

Furthermore, it will be appreciated that the optical characteristics (e.g., the optical flatness and surface roughness) of the reflective surface are designed in a manner so that the reflective surface is able to reflect a broad spectrum of wavelengths. To clarify, previously it was mentioned how the reflective photodiode is able to intercept and reflect incident light while allowing some of that incident light to be absorbed by a photodiode positioned underneath a layer of reflective coating. It is desirable for the reflective coating layer or portion of the reflective photodiode to have minimal impact on the attributes of the light it reflects. To clarify, it is desirable for the reflective coating to not bend the laser light in a manner that reduces the coherence or spectral properties of the light. Instead, it is desirable to structure the reflective coating so that it just reflects the light. In accordance with the disclosed principles, the embodiments can be structured in a manner where the optical flatness and surface roughness of the reflective coating will have minimal or nominal impact on the light qualities of the laser light. As such, the reflective photodiode has sufficient optical quality to act as a turning optic. For instance, turning briefly to FIG. 5B, this figure illustrates a surface scan 525 of a reflective photodiode showing the measured height profile of a photodiode. As shown, the profile is substantially uniform across the entire X-Y plane. FIG. 5B also shows the surface profile 530 of the photodiode. Again, the profile is substantially flat, with a surface bow of under 100 nm over the entire surface (e.g., here, the surface is approximately 3 mm in width). Such a small amount or degree of surface bow provides for a high degree of optical flatness and a low degree of surface roughness.

Determining the power output allows the system to recalibrate itself if too much or too little power is being expended (e.g., as a result of changes to lasing current threshold or slope efficiency resulting from temperature or environmental changes). As such, the reflective photodiode is able to provide feedback to the laser assembly. This feedback is based on a measurement of the first portion of the incident light and is provided to control the output of the laser assembly.

FIG. 6 shows an example implementation of method 500 from FIG. 5A. Specifically, FIG. 6 shows an illumination system 600 that includes a light source 605 that is emitting incident light 610. Incident light 610 is shown as striking a reflective photodiode/turning optic 615, which is representative of the earlier reflective photodiodes and which may be a single section photodiode or a multi-section photodiode. Some light will be reflected by the reflective photodiode/turning optic 615's HR coating, as shown by reflected light 620, while some light will be absorbed, as shown by absorbed light 625.

The absorbed light 625 will be converted to an electrical current and will be used to determine a current power output of the light source 605. The value or measurement of the electrical current can then be included as feedback 630 to the light source 605 to determine whether the power output of light source 605 needs to be adjusted or calibrated in any manner.

Mixed-Reality Systems

Mixed-reality systems, including virtual-reality (VR) and augmented-reality (AR) systems, have received significant attention because of their ability to create truly unique experiences for their users. For reference, conventional VR systems create a completely immersive experience by restricting their users' views to only virtual environments. This is often achieved through the use of a head-mounted device (HMD) that completely blocks any view of the real world. As a result, a user is entirely immersed within the virtual environment. In contrast, conventional AR systems create an augmented-reality experience by visually presenting virtual images (i.e. "holograms") that are placed in or that interact with the real world.

As used herein, VR and AR systems are described and referenced interchangeably. Unless stated otherwise, the descriptions herein apply equally to all types of mixed-reality systems, which (as detailed above) include AR systems, VR systems, and/or any other similar system capable of displaying virtual images. As used herein, the term "virtual image" collectively refers to images rendered within a VR environment as well as images/holograms rendered in an AR environment.

Figure 7A:
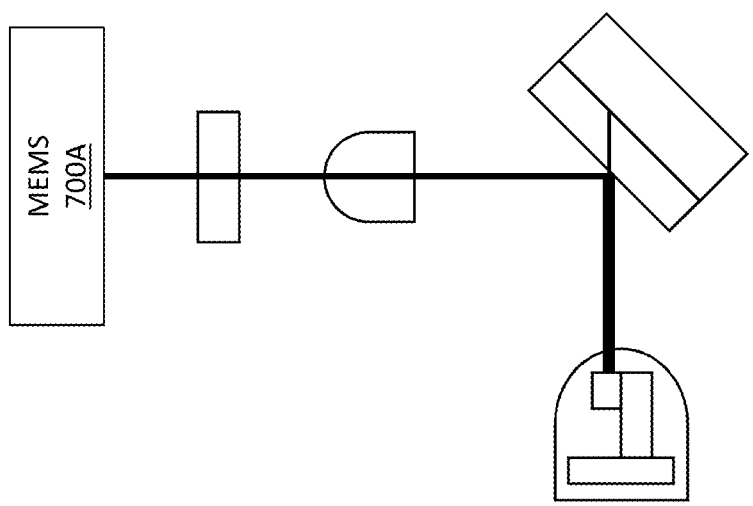
FIG. 7A illustrates how a microelectromechanical scanning (MEMS) mirror system may be used in conjunction with a laser and its associated beam forming and measuring components (e.g., collimating optics, beam combiners, photodiodes, etc.) in order to produce virtual images for a mixed-reality system.

Some, but not necessarily all, of the disclosed embodiments are operable in conjunction with a mixed-reality computing system (e.g., the laser-based systems are able to generate the virtual images for the mixed-reality computing system). In some cases, the mixed-reality system includes a microelectromechanical scanning ("MEMS") mirror system. As shown in FIG. 7A, a MEMS mirror system 700A is able to receive light that has been measured and reflected by a reflective photodiode in accordance with the principles discussed earlier. Because FIG. 7A is substantially similar to FIG. 2A, the common components have not been relabeled for brevity purposes.

As mixed-reality systems become smaller and smaller, it is highly desirable to reduce the size of the laser and its associated components (e.g., the collimating optics, beam combiners, and photodiodes). By providing a multi-purposed photodiode, which operates as both a photodiode and a high performance turning optic, the disclosed embodiments are able to beneficially reduce the size (and even the number) of hardware components used in the mixed-reality system. As such, the disclosed reflective photodiodes are particularly useful and beneficial in mixed-reality systems. It will be appreciated, however, that the disclosed reflective photodiodes can be used in other applications, and they should not be limited solely to mixed-reality systems.

Figure 7B:
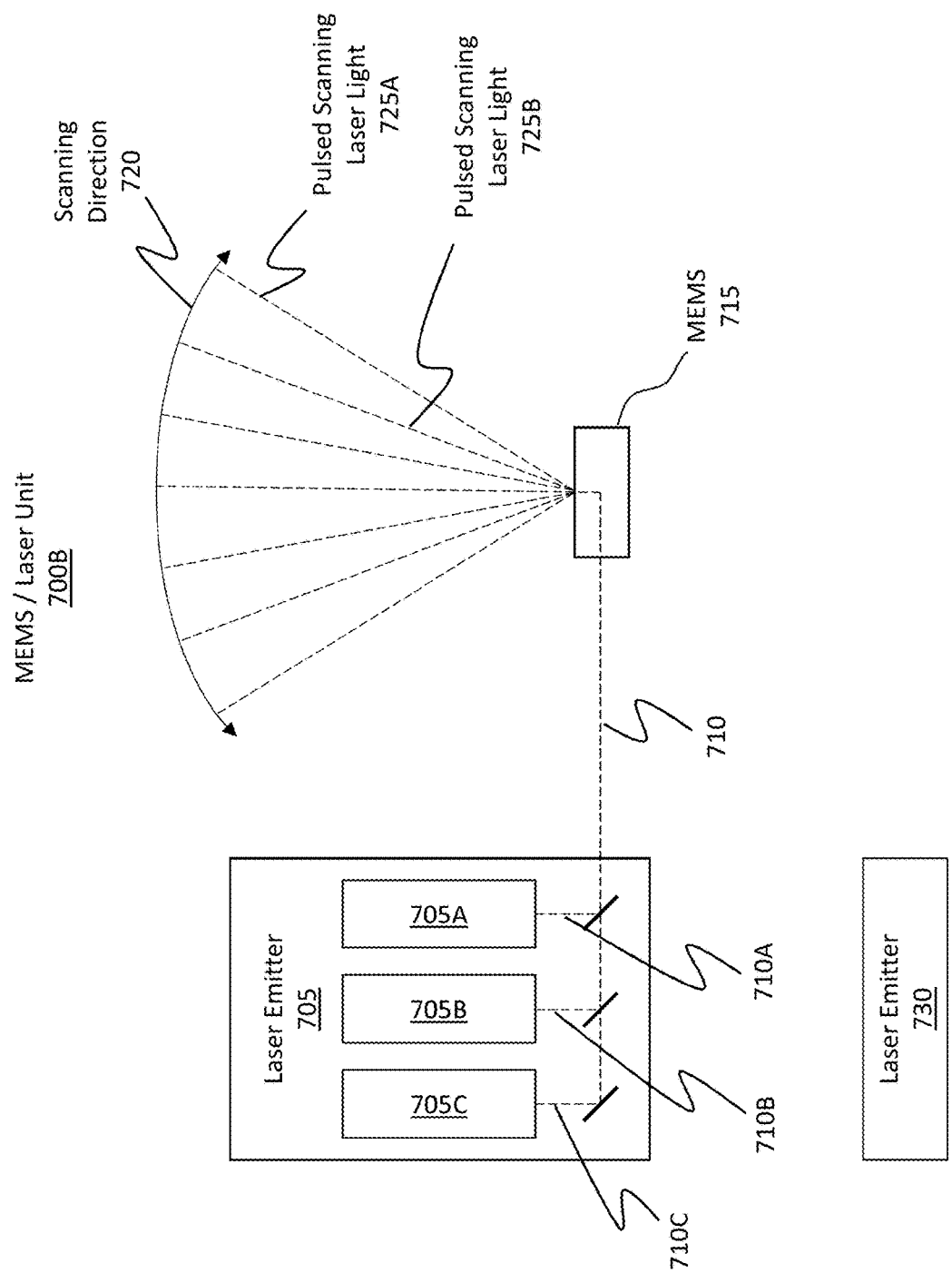
FIG. 7B provides additional detail regarding the operations of a MEMS mirror system within a mixed-reality system.

FIG. 7B shows some components that may be included within a display for a mixed-reality computing system. These components are beneficially provided to render the virtual images that were discussed earlier. Specifically, FIG. 7B shows a MEMS/laser unit 700B, which is representative of MEMS mirror system 700A from FIG. 7A and which includes a laser emitter 705 that functions as a projector for the mixed-reality display and that may be representative of the light sources and lasers discussed earlier. Although not illustrated in FIG. 7B, it will be appreciated that the MEMS/laser unit 700B may additionally include the reflective photodiodes that were discussed earlier.

Laser emitter 705 (or laser assembly) includes a (first) laser 705A, a (second) laser 705B, and a (third) laser 705C. Examples of these lasers may be a red laser, a green laser, and a blue laser such that the laser emitter 705 is a red, green, blue (RGB) laser assembly having RGB lasers. While only three lasers are presently shown, it will be appreciated that laser emitter 705 may include any number of lasers. Moreover, in some embodiments, lasers 705A, 705B, and 705C may be included within their own different discrete laser assemblies. In some embodiments, an infrared (IR) laser may be included as a part of laser emitter 705 or within a separate assembly/emitter.

In some embodiments, such as the one shown in FIG. 7B, the laser light from the lasers 705A, 705B, and 705C is optically/spectrally combined to form RGB laser light 710. That is, the laser light 710A from laser 705A, the laser light 710B from laser 705B, and the laser light 710C from laser 705C is optically/spectrally combined (e.g., either within the laser emitter 705 or outside of the laser emitter 705) to produce a single collimated beam of red, green, and blue RGB laser light 710 (e.g., via use of beam combiner(s), collimating optic(s), and reflective photodiode(s), as described earlier). It will be appreciated that laser light 710 may be a continuous beam of laser light, or, alternatively, it may be a pulsed beam of laser light. In the example shown in FIG. 7B, the laser light 710 is a pulsed beam, as demonstrated by its dashed-line illustration. It will also be appreciated that the laser light may pass through any number of reflective photodiodes, either before or after being spectrally combined and/or collimated, as discussed earlier.

The laser light 710 is then directed to a microelectromechanical scanning ("MEMS") mirror system 715. The MEMS mirror system 715 includes a multi-directional mirror array that is able to rapidly redirect and aim laser light to any desired pixel location. For example, scanning direction 720 shows how the MEMS mirror system 715 is able to rapidly redirect pulsed (or continuous) scanning laser light 725A and pulsed scanning laser light 725B to any location. Here, pulsed scanning laser light 725A and 725B originate from the laser light 710. While only two instances of the pulsed scanning laser light (e.g., 725A and 725B) are labeled, it will be appreciated that the MEMS mirror system 715 is able to redirect any number of pulsed emissions. By scanning laser light back and forth horizontally and up and down vertically, the MEMS/laser unit 700B is able to illuminate individual pixels of a virtual image within a desired field of view. Because the MEMS/laser unit 700B is able to illuminate individual pixels so rapidly, the MEMS/laser unit 700B is able to render an entire virtual image (e.g., an image frame) for a user to view and interact with without the user realizing that the virtual image was progressively generated by scanning individual pixels.

In some embodiments, the MEMS/laser unit 700B includes more than one laser emitter. For instance, FIG. 7B shows a (second) laser emitter 730. In cases where there are more than one laser emitter, then the emitters can be configured to jointly or concurrently illuminate pixels to generate an image frame. For instance, in some embodiments, an image frame is illuminated by two separate laser emitters (e.g., laser emitter 705 and laser emitter 730). In some cases, the two separate laser emitters concurrently illuminate corresponding pixels. In other cases, the two separate laser emitters stagger when pixels are illuminated.

Figure 8B:
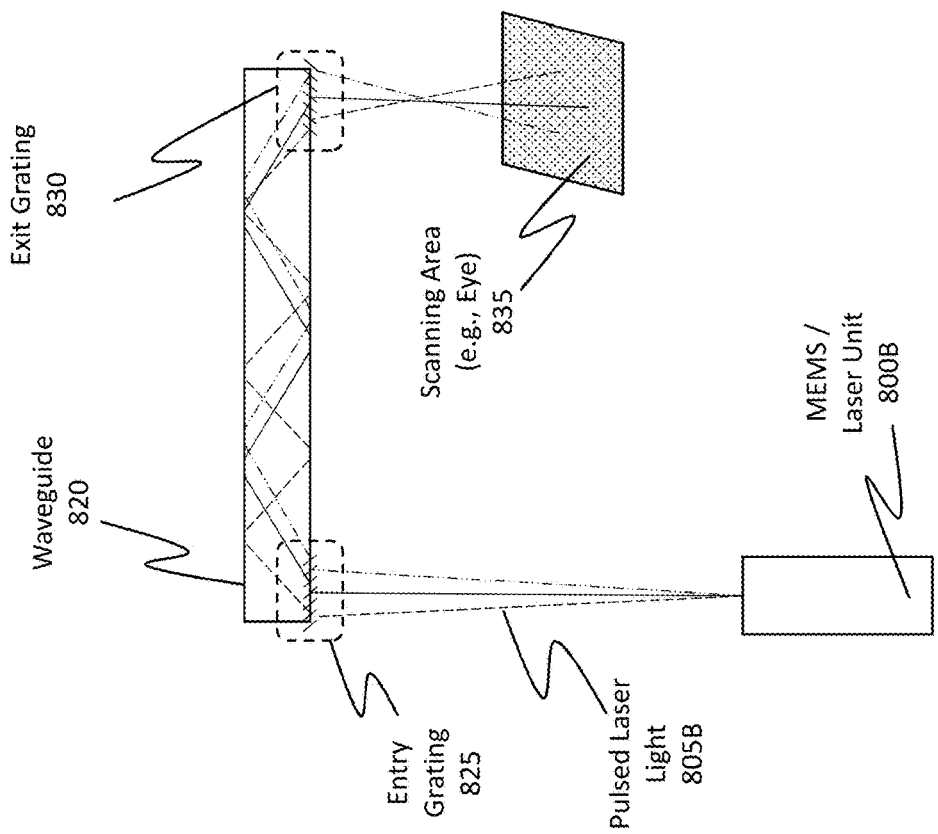
FIG. 8B illustrates an example of a MEMS/laser system being used in an AR system having a waveguide display.
Figure 8A:
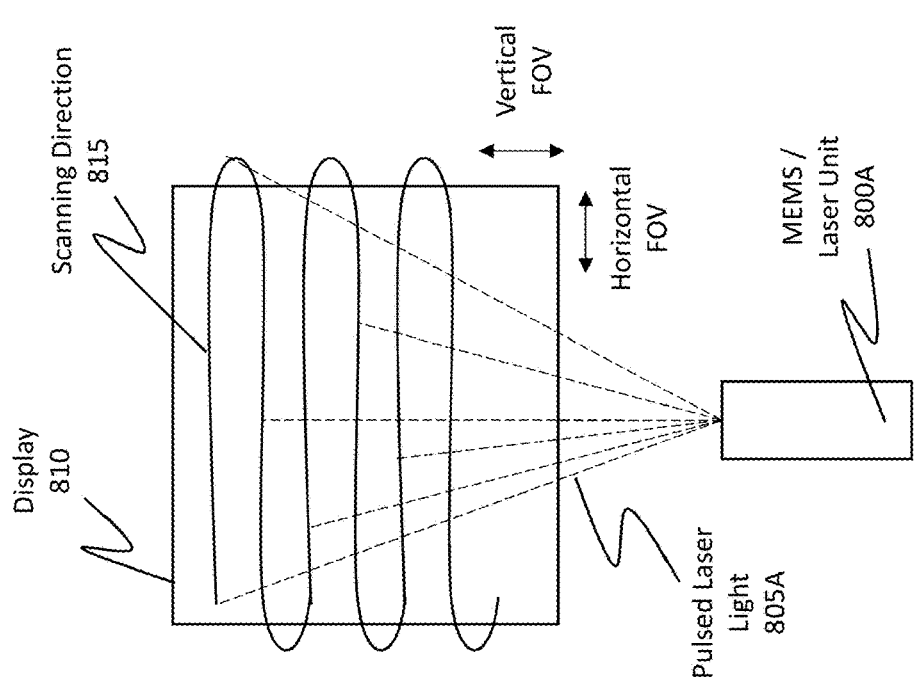
FIG. 8A illustrates an example of a MEMS/laser system being used in a VR system having a display.

FIGS. 8A and 8B provide further clarification by showing how a MEMS/laser unit 800A can be used in a VR environment and how a MEMS/laser unit 800B can be used in an AR environment, respectively. MEMS/laser units 800A and 800B are both example implementations of the MEMS/laser unit 700B from FIG. 7B. Pulsed laser light 805A in FIG. 8A and pulsed laser light 805B in FIG. 8B are example implementations of laser light 710 and pulsed scanning laser light 725A and 725B from FIG. 7B.

In FIG. 8A, the display 810 is representative of a VR display. In a VR environment, the user's view of the real-world is entirely occluded such that the user is able to see only the VR environment. Here, display 810 is shown as including a vertical field of view ("FOV") and a horizontal FOV. FIG. 8A also shows the progressively backward and forward horizontal and upward and downward vertical scanning direction 815 in which the MEMS/laser unit 800A is able to scan individual images of a virtual image onto the display 810. By rapidly scanning/rastering the individual pixels, the MEMS/laser unit 800A is able to render an entire virtual image or even an entire VR environment.

It will be appreciated that each pixel rastered on the display 810 is generated by pulsing the laser included within the MEMS/laser unit 800A. In this manner, it is possible to illuminate each pixel on display 810 in a pixel-by-pixel basis all the way from the top portion of the display 810 to the bottom portion of the display 810. Consequently, as the MEMS mirror system in the MEMS/laser unit 800A is scanned/aimed at a given pixel position on the display 810, the laser is pulsed to a determined intensity or power output level so as to properly illuminate that pixel within the overall virtual image.

FIG. 8B shows an example implementation within an AR system. Instead of scanning pixels on a display (e.g., display 810), the AR system causes its MEMS/laser unit 800B to scan pixels onto the user's eye through the use of a waveguide 820, which receives the laser light and then directs the laser light towards the user's eye.

To illustrate, FIG. 8B shows the MEMS/laser unit 800B generating pulsed laser light 805B which is directed towards the waveguide 820. This waveguide 820 includes an entry grating 825, through which the pulsed laser light 805B enters the waveguide 820, and an exit grating 830, through which the pulsed laser light 805B exits the waveguide 820. The waveguide 820 is structured to enable the pulsed laser light 805B to propagate through it so that the pulsed laser light 805B can be redirected to a desired location, such as the scanning area 835. In many instances, the scanning area 835 corresponds to a user's eye. In this regard, there is a display module (e.g., the MEMS/laser unit 800B) that shines light into a waveguide (e.g., waveguide 820). Light is then refracted/reflected along that waveguide and then coupled out of the waveguide towards the user's eye. As such, instead of scanning light onto the display 810 in the VR scenario, pulsed laser light can be scanned to a user's eye in the AR scenario. Similar to the earlier discussion, the intensity or brightness of a pixel is referred to herein as the illumination energy for that pixel.

Accordingly, some embodiments are directed to an illumination system that renders images in a mixed-reality system. This illumination system may include a laser assembly (e.g., light source 205 from FIG. 2A) that includes a red laser, a green laser, a blue laser, and/or an infrared laser, where each one of the red laser, the green laser, the blue laser, and the infrared laser is associated with a corresponding collimating optic (e.g., collimating optic 240A from FIG. 2A) and where the red laser emits red laser light, the green laser emits green laser light, the blue laser emits blue laser light, and the infrared laser emits infrared laser light. In some embodiments, the illumination system includes one or more collimating optics that collimate the laser light generated by the laser assembly (e.g., a first collimating optic for the red laser light, a second collimating optic for the green laser light, a third collimating optic for the blue laser light, and a fourth collimating optic for the infrared laser light).

The illumination system may additionally include a single section reflective photodiode and/or a multi-section reflective photodiode configured in the manner described earlier. The single or multi-section reflective photodiode is configured to determine a power output of the laser assembly by absorbing/receiving and measuring portions of the laser light generated by the laser assembly.

The illumination system may also include a beam combiner (e.g., beam combiner 245 from FIG. 2A) that combines portions of the red laser light, portions of the green laser light, portions of the blue laser light, and/or portions of the infrared laser light generated by the laser assembly to form combined laser light. The illumination system may also include a MEMS mirror system that redirects the combined laser light (or potentially uncombined laser light) generated by the laser assembly to illuminate pixels in an image frame for the mixed-reality system.

In some implementations, the single or multi-section photodiode is positioned upstream of the beam combiner such that the single or multi-section photodiode is positioned between the laser assembly and the beam combiner relative to a path traveled by the red laser light, the green laser light, the blue laser light, and/or the infrared laser light from the laser assembly to the beam combiner. In some implementations, the single or multi-section photodiode is positioned upstream of the collimating optics of the red laser, the green laser, the blue laser, and/or the infrared laser such that the single or multi-section photodiode is positioned between the laser assembly and the collimating optics. In other implementations, the single or multi-section photodiode is positioned downstream of the collimating optics and/or downstream of the beam combiner. In some implementations, the single or multi-section photodiode is positioned downstream relative to the collimating optics and is positioned upstream relative to the beam combiner.

Accordingly, the disclosed embodiments relate to an improved type of reflective photodiode. Because the reflective photodiode has multiple functions/purposes, it can now be placed within the illumination system at many different locations, thereby providing an increasingly flexible architecture/design.

Example Computer System(s)

Figure 9:
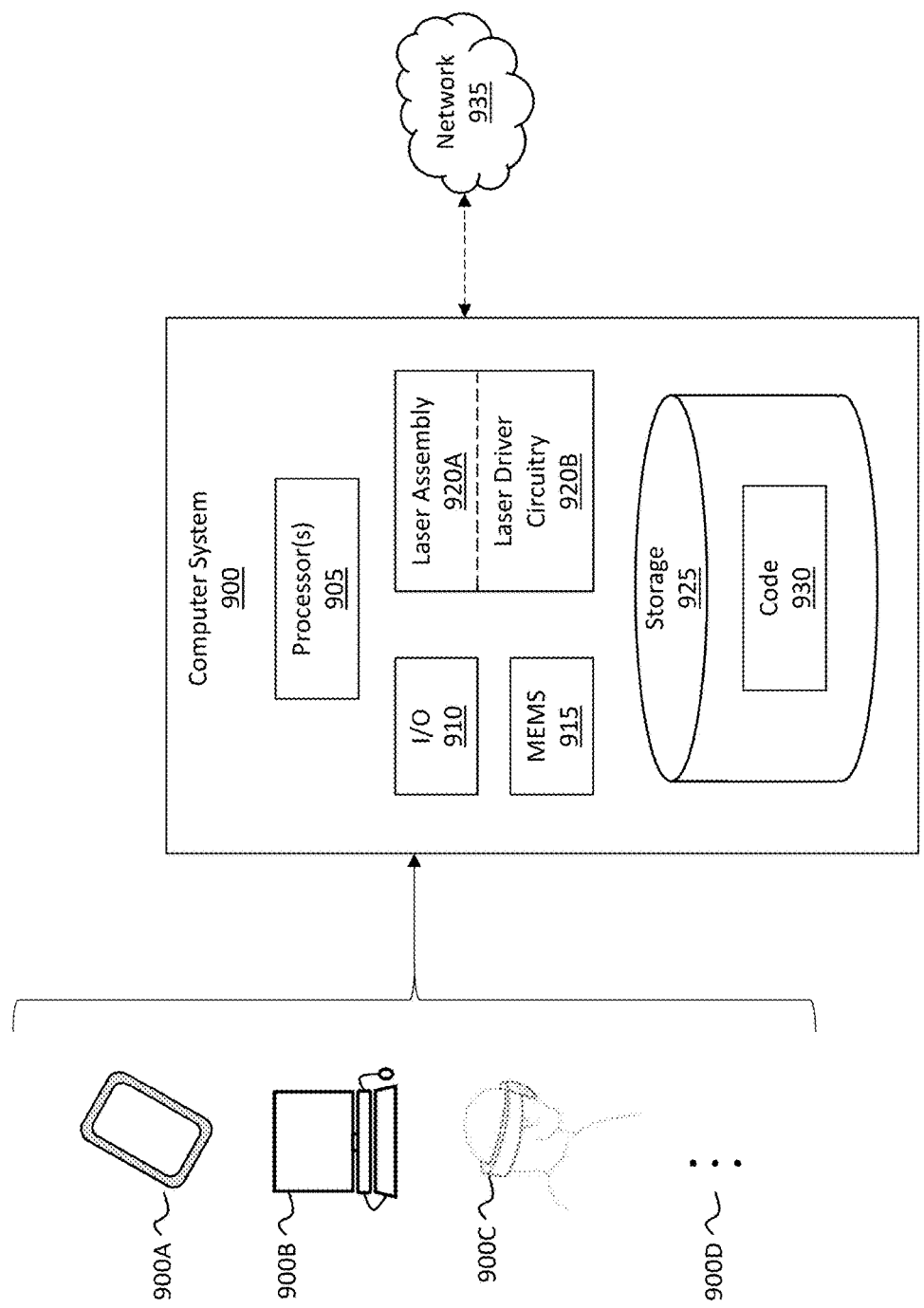
FIG. 9 illustrates an example computer system that is operable to control the components described herein.

Attention will now be directed to FIG. 9 which illustrates an example computer system 900 that may be used to facilitate the disclosed methods and/or that may comprise one of the disclosed systems, architectures, or illumination systems. It will be appreciated that computer system 900 may be configured within various form factors. For example, computer system 900 may be embodied as a tablet 900A, a desktop 900B, or a head mounted device (HMD) 900C. The ellipsis 900D demonstrates that computer system 900 may be embodied in various other forms too. For instance, computer system 900 may also be a distributed system that includes one or more connected computing components/devices that are in communication with computer system 900, a laptop computer, a mobile phone, a server, a data center, and/or any other computer system. The ellipsis 900D also indicates that other system subcomponents may be included or attached with the computer system 900, including, for example, sensors that are configured to detect sensor data such as user attributes (e.g., heart rate sensors), as well as sensors like cameras and other sensors that are configured to detect sensor data such as environmental conditions and location/positioning (e.g., clocks, pressure sensors, temperature sensors, gyroscopes, accelerometers and so forth), all of which sensor data may comprise different types of information used during application of the disclosed embodiments.

In its most basic configuration, computer system 900 includes various different components. For example, FIG. 9 shows that computer system 900 includes at least one processor 905 (aka a "hardware processing unit"), input/output ("I/O") 910, a MEMS mirror system 915, a laser assembly 920A with laser driver circuitry 920B, and storage 925. As used in conjunction with computer system 900, laser assembly 920A should be interpreted broadly to include the laser emitters, collimating optics, beam combiners, and reflective photodiodes that were discussed earlier. Accordingly, any of the previously mentioned lasing or optical devices may be included as a part of laser assembly 920A. Laser driver circuitry 920B is configured to control the power output and emissions of the lasing and optical devices and/or control the operations of the laser assembly 920A (e.g., including any feedback or measurement performed by any reflective photodiodes).

Computer system 900 may also include a depth engine which includes any type of 3D sensing hardware to scan and generate a spatial mapping of an environment. For instance, the depth engine may include any number of time of flight cameras, stereoscopic cameras, and/or depth cameras. Using these cameras, the depth engine is able to capture images of an environment and generate a 3D representation of that environment. Accordingly, depth engine includes any hardware and/or software components necessary to generate a spatial mapping (which may include depth maps, 3D dot/point clouds, and/or 3D meshes) used to generate or influence virtual images.

Storage 925 is shown as including executable code/instructions 930. Storage 925 may be physical system memory, which may be volatile, non-volatile, or some combination of the two. The term "memory" may also be used herein to refer to non-volatile mass storage such as physical storage media. If computer system 900 is distributed, the processing, memory, and/or storage capability may be distributed as well. As used herein, the term "executable module," "executable component," or even "component" can refer to software objects, routines, or methods that may be executed on computer system 900. The different components, modules, engines, and services described herein may be implemented as objects or processors that execute on computer system 900 (e.g. as separate threads).

The disclosed embodiments may comprise or utilize a special-purpose or general-purpose computer including computer hardware, such as, for example, one or more processors (such as processor 905) and system memory (such as storage 925), as discussed in greater detail below. Embodiments also include physical and other computer-readable media for carrying or storing computer-executable instructions and/or data structures. Such computer-readable media can be any available media that can be accessed by a general-purpose or special-purpose computer system. Computer-readable media that store computer-executable instructions in the form of data are physical computer storage media. Computer-readable media that carry computer-executable instructions are transmission media. Thus, by way of example and not limitation, the current embodiments can comprise at least two distinctly different kinds of computer-readable media: computer storage media and transmission media.

Computer storage media are hardware storage devices, such as RAM, ROM, EEPROM, CD-ROM, solid state drives (SSDs) that are based on RAM, Flash memory, phase-change memory (PCM), or other types of memory, or other optical disk storage, magnetic disk storage or other magnetic storage devices, or any other medium that can be used to store desired program code means in the form of computer-executable instructions, data, or data structures and that can be accessed by a general-purpose or special-purpose computer.

Computer system 900 may also be connected (via a wired or wireless connection) to external sensors (e.g., one or more remote cameras, accelerometers, gyroscopes, acoustic sensors, magnetometers, etc.). Further, computer system 900 may also be connected through one or more wired or wireless networks 935 to remote systems(s) that are configured to perform any of the processing described with regard to computer system 900.

During use, a user of computer system 900 is able to perceive information (e.g., a mixed-reality environment) through a display screen that is included with the I/O 910 of computer system 900 and that is visible to the user. The I/O interface(s) and sensors with the I/O 910 also include gesture detection devices, eye trackers, and/or other movement detecting components (e.g., cameras, gyroscopes, accelerometers, magnetometers, acoustic sensors, global positioning systems ("GPS"), etc.) that are able to detect positioning and movement of one or more real-world objects, such as a user's hand, a stylus, and/or any other object(s) that the user may interact with while being immersed in the scene.

A graphics rendering engine may also be configured, with processor 905, to render one or more virtual objects within a mixed-reality scene/environment. As a result, the virtual objects accurately move in response to a movement of the user and/or in response to user input as the user interacts within the virtual scene.

A "network," like the network 935 shown in FIG. 9, is defined as one or more data links and/or data switches that enable the transport of electronic data between computer systems, modules, and/or other electronic devices. When information is transferred, or provided, over a network (either hardwired, wireless, or a combination of hardwired and wireless) to a computer, the computer properly views the connection as a transmission medium. Computer system 900 will include one or more communication channels that are used to communicate with the network 935. Transmissions media include a network that can be used to carry data or desired program code means in the form of computer-executable instructions or in the form of data structures. Further, these computer-executable instructions can be accessed by a general-purpose or special-purpose computer. Combinations of the above should also be included within the scope of computer-readable media.

Upon reaching various computer system components, program code means in the form of computer-executable instructions or data structures can be transferred automatically from transmission media to computer storage media (or vice versa). For example, computer-executable instructions or data structures received over a network or data link can be buffered in RAM within a network interface module (e.g., a network interface card or "NIC") and then eventually transferred to computer system RANI and/or to less volatile computer storage media at a computer system. Thus, it should be understood that computer storage media can be included in computer system components that also (or even primarily) utilize transmission media.

Computer-executable (or computer-interpretable) instructions comprise, for example, instructions that cause a general-purpose computer, special-purpose computer, or special-purpose processing device to perform a certain function or group of functions. The computer-executable instructions may be, for example, binaries, intermediate format instructions such as assembly language, or even source code. Although the subject matter has been described in language specific to structural features and/or methodological acts, it is to be understood that the subject matter defined in the appended claims is not necessarily limited to the described features or acts described above. Rather, the described features and acts are disclosed as example forms of implementing the claims.

Those skilled in the art will appreciate that the embodiments may be practiced in network computing environments with many types of computer system configurations, including personal computers, desktop computers, laptop computers, message processors, hand-held devices, multi-processor systems, microprocessor-based or programmable consumer electronics, network PCs, minicomputers, mainframe computers, mobile telephones, PDAs, pagers, routers, switches, and the like. The embodiments may also be practiced in distributed system environments where local and remote computer systems that are linked (either by hardwired data links, wireless data links, or by a combination of hardwired and wireless data links) through a network each perform tasks (e.g. cloud computing, cloud services and the like). In a distributed system environment, program modules may be located in both local and remote memory storage devices.

Additionally, or alternatively, the functionality described herein can be performed, at least in part, by one or more hardware logic components (e.g., the processor 905). For example, and without limitation, illustrative types of hardware logic components that can be used include Field-Programmable Gate Arrays (FPGAs), Program-Specific or Application-Specific Integrated Circuits (ASICs), Program-Specific Standard Products (ASSPs), System-On-A-Chip Systems (SOCs), Complex Programmable Logic Devices (CPLDs), Central Processing Units (CPUs), and other types of programmable hardware.

It will be appreciated that computer system 900 may include one or more processors (e.g., processor(s) 905) and one or more computer-readable hardware storage devices (e.g., storage 925), where the storage devices include computer-executable instructions that are executable by the one or more processors to perform any method (e.g., method 500 presented in FIG. 5A). In this regard, computer system 900 is also highly flexible and can perform numerous operations.

The present invention may be embodied in other specific forms without departing from its spirit or characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An illumination system that renders images in a mixed-reality system and that enables a reflective photodiode, which provides feedback control for an illuminating laser, to be placed within the illumination system at a location proximate to the illuminating laser to thereby facilitate improved feedback control for the illuminating laser, the illumination system comprising:
    a laser assembly that includes red, green, blue (RGB) lasers;
    a microelectromechanical scanning (MEMS) mirror system that redirects laser light generated by the laser assembly to illuminate pixels in an image frame for the mixed-reality system;
    a beam combiner that combines the laser light generated by the laser assembly; and
    the photodiode that determines a power output of the laser assembly by receiving and measuring a first portion of the laser light generated by the laser assembly and reflects laser light towards the beam combiner,
    wherein the photodiode is positioned upstream of the beam combiner such that the photodiode is positioned between the laser assembly and the beam combiner relative to a path traveled by the laser light from the laser assembly to the beam combiner, which positioning causes the laser light to pass through fewer optics as compared to positioning the photodiode downstream of the beam combiner.

2. The illumination system of claim 1, wherein the photodiode is positioned upstream of a collimating optic such that the photodiode is positioned between the laser assembly and the collimating optic.

3. The illumination system of claim 1, wherein the laser assembly further includes an infrared laser.

4. The illumination system of claim 1, wherein a size of the laser light when received at the photodiode is within a range spanning 50 µm and 3 mm.

5. The illumination system of claim 1, wherein the photodiode comprises:
    a light receiving surface configured to absorb a first portion of the laser light directed at the photodiode by the laser assembly and to convert the first portion of the laser light into electrical current; and
    a reflective coating disposed on the light receiving surface, wherein the reflective coating is configured to reflect a second portion of the laser light away from the light receiving surface while permitting the first portion of the laser light to pass through the reflective coating and to be absorbed by the light receiving surface.

6. The illumination system of claim 5, wherein the reflective coating is configured to reflect at least 80% of the laser light.

7. The illumination system of claim 6, wherein the reflective coating is configured to reflect at least 90% of the laser light.

8. The illumination system of claim 7, wherein the reflective coating is configured to reflect at least 95% of the laser light.

9. The illumination system of claim 1, wherein the photodiode measures the power output of the laser assembly and provides the measured power output as feedback to control the laser assembly.

10. The illumination system of claim 1, wherein the photodiode reflects a majority of the laser light generated by the laser assembly while permitting a minority of the laser light to be absorbed by a light receiving surface of the photodiode.

11. The illumination system of claim 1, wherein the beam combiner is a dichroic prism.

12. An illumination system that renders images in a mixed-reality system and that enables a multi-section reflective photodiode, which provides feedback control for illuminating lasers, to be placed within the illumination system at a location proximate to the illuminating lasers to thereby facilitate improved feedback control for the illuminating lasers, the illumination system comprising:
    a laser assembly that includes a red laser, a green laser, and a blue laser, wherein the red laser, the green laser, and the blue laser are associated with at least one collimating optic, and wherein the red laser emits red laser light, the green laser emits green laser light, and the blue laser emits blue laser light;
    the multi-section photodiode that includes a red section photodiode for absorbing and measuring a first portion of the red laser light, a green section photodiode for absorbing and measuring a first portion of the green laser light, and a blue section photodiode for absorbing and measuring a first portion of the blue laser light, wherein the first portions of the red laser light, the green laser light, and the blue laser light are used to determine a power output of the laser assembly;

a beam combiner that combines a second portion of the red laser light, a second portion of the green laser light, and a second portion of the blue laser light generated by the laser assembly to form combined laser light; and a microelectromechanical scanning (MEMS) mirror system that redirects the combined laser light to illuminate pixels in an image frame for the mixed-reality system, wherein the multi-section photodiode is positioned upstream of the beam combiner and reflects laser light towards the beam combiner such that the multi-section photodiode is positioned between the laser assembly and the beam combiner relative to a path traveled by the red laser light, the green laser light, and the blue laser light from the laser assembly to the beam combiner, which positioning causes the red laser light, the green laser light, and the blue laser light to pass through fewer optics as compared to positioning the multi-section photodiode downstream of the beam combiner.

13. The illumination system of claim 12, wherein the first portions of the red laser light, the green laser light, and the blue laser light are less than 20% of the red laser light, the green laser light, and the blue laser light, respectively.

14. The illumination system of claim 12, wherein the first portions of the red laser light, the green laser light, and the blue laser light are less than 10% of the red laser light, the green laser light, and the blue laser light, respectively.

15. The illumination system of claim 12, wherein the first portions of the red laser light, the green laser light, and the blue laser light are less than 5% of the red laser light, the green laser light, and the blue laser light, respectively.

16. The illumination system of claim 12, wherein the multi-section photodiode is positioned upstream of the at least one collimating optic associated with the red laser, the green laser, and the blue laser such that the multi-section photodiode is positioned between the laser assembly and the at least one collimating optic.

17. The illumination system of claim 12, wherein sizes of the red laser light, the green laser light, and the blue laser light when received at the multi-section photodiode are within a range spanning 50 μm and 3 mm.

18. An illumination system that renders images in a mixed-reality system and that enables a reflective photodiode, which provides feedback control for an illuminating laser, to be placed within the illumination system at a location proximate to the illuminating laser to thereby facilitate improved feedback control for the illuminating laser, the illumination system comprising:

a laser assembly that includes a red laser, a green laser, and a blue laser, wherein the red laser emits red laser light, the green laser emits green laser light, and the blue laser emits blue laser light;

a first collimating optic that collimates the red laser light, a second collimating optic that collimates the green laser light, and a third collimating optic that collimates the blue laser light;

the photodiode that absorbs and measures a first portion of the collimated red laser light, a first portion of the collimated green laser light, and a first portion of the collimated blue laser light, wherein the first portions of the collimated red laser light, the collimated green laser light, and the collimated blue laser light are used to determine a power output of the laser assembly;

a beam combiner that combines a second portion of the collimated red laser light, a second portion of the collimated green laser light, and a second portion of the collimated blue laser light to form combined laser light; and a microelectromechanical scanning (MEMS) mirror system that redirects the combined laser light to illuminate pixels in an image frame for the mixed-reality system, wherein the photodiode is positioned downstream relative to the first, second, and third collimating optics and is positioned upstream relative to the beam combiner and reflects laser light towards the beam combiner, which positioning causes the red laser light, the green laser light, and the blue laser light to pass through fewer optics as compared to positioning the photodiode downstream of the beam combiner.

19. The illumination system of claim 18, wherein the photodiode reflects the second portions of the collimated red laser light, the collimated green laser light, and the collimated blue laser light.

20. The illumination system of claim 19, wherein the photodiode includes a reflective coating that is configured to reflect the second portions of the collimated red laser light, the collimated green laser light, and the collimated blue laser light.

21. The illumination system of claim 20, wherein the second portions of the collimated red laser light, the collimated green laser light, and the collimated blue laser light constitute at least 90% of the collimated red laser light, the collimated green laser light, and the collimated blue laser light, respectively.

* * * * *